(12) United States Patent
Tsai et al.

(10) Patent No.: US 12,471,352 B2
(45) Date of Patent: Nov. 11, 2025

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Kuo-Chiang Tsai, Hsinchu (TW); Tien-Hung Cheng, Hsinchu (TW); Jeng-Ya Yeh, New Taipei (TW); Mu-Chi Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 643 days.

(21) Appl. No.: 17/879,766

(22) Filed: Aug. 2, 2022

(65) Prior Publication Data

US 2024/0047547 A1    Feb. 8, 2024

(51) Int. Cl.
H01L 29/45 (2006.01)
H10D 64/01 (2025.01)
H10D 64/62 (2025.01)

(52) U.S. Cl.
CPC ............. *H10D 64/62* (2025.01); *H10D 64/01* (2025.01)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2022/0293742 A1* | 9/2022 | Tsai ............. H10D 64/62 |
| 2023/0036693 A1* | 2/2023 | Lin ............... H01L 21/76895 |
| 2024/0038658 A1* | 2/2024 | Tsai ............. H10D 84/834 |

* cited by examiner

*Primary Examiner* — William C Trapanese
(74) *Attorney, Agent, or Firm* — JCIPRNET

(57) ABSTRACT

A semiconductor device includes a source via having a body portion and a barrier layer surrounding the body portion, and the body portion is in physical contact with the source contact. Furthermore, the barrier layer includes at least one sidewall section separating the source via from an adjacent via structure. As such, the via to via leakage may be prevented. Overall, by providing a semiconductor device having the above structures, the contact resistance is reduced, and the device performance is further improved.

20 Claims, 21 Drawing Sheets

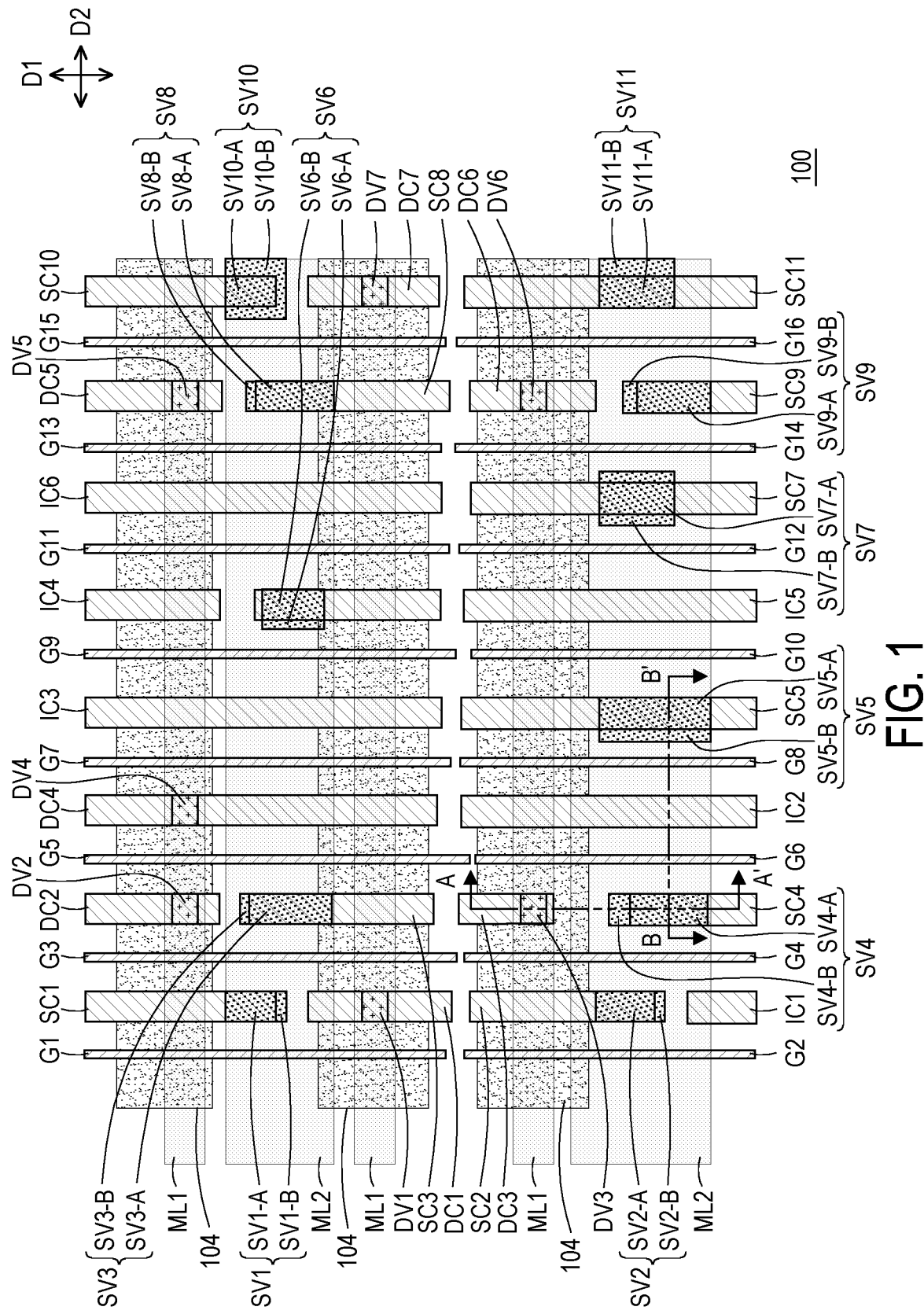

SEMICONDUCTOR DEVICE AND METHOD OF FABRICATING THE SAME

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1 is a top view of a semiconductor device in accordance with some embodiments of the present disclosure.

DETAILED DESCRIPTION

Figure 2A:
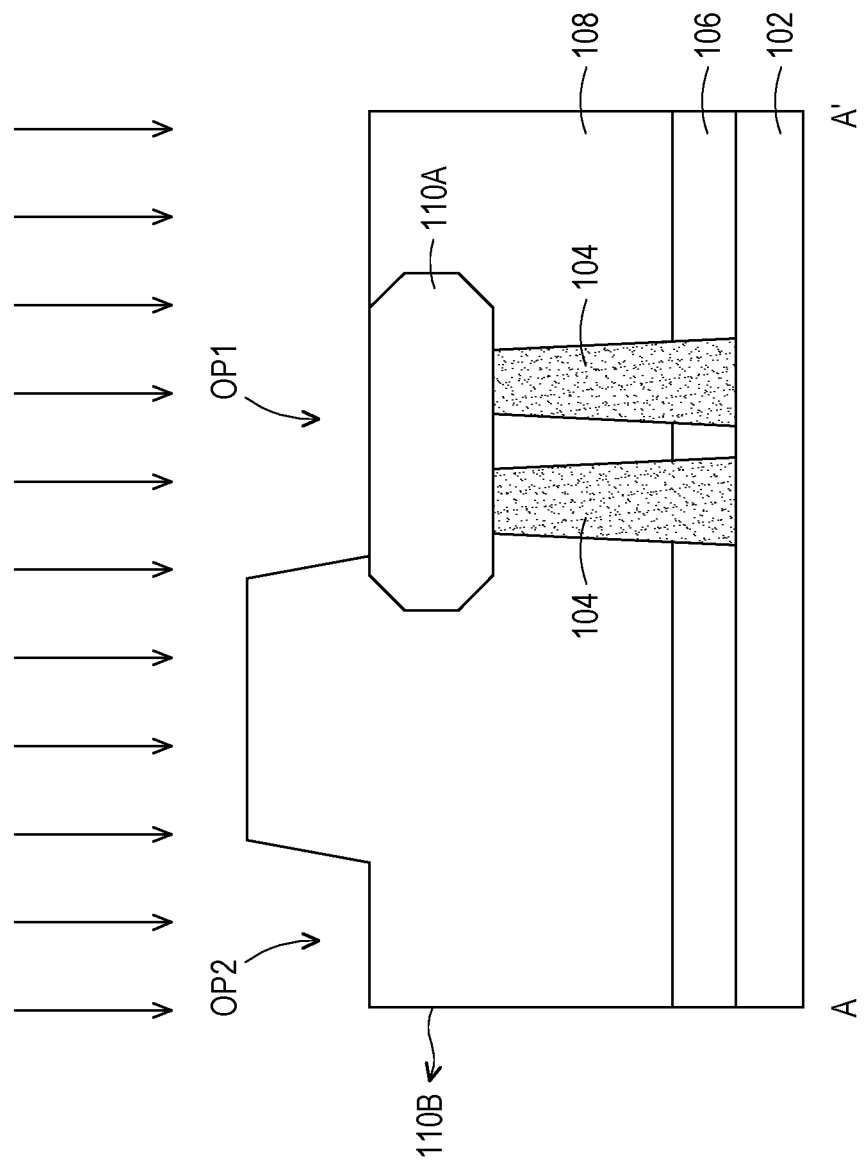
FIG. 2A to FIG. 9B are schematic sectional views of various stages in a method of fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

As semiconductor fabrication progresses to ever smaller technology nodes, the overall contribution made by contact resistances may begin to degrade device performance such as device speed. In general, contact resistance reduces when the contact surface area increases. It is noted that the contact surface area on the source side is often determined by the via structure designs. On the other hand, contact surface area on the drain side is often limited to the metal line width regardless of the via structure designs. Furthermore, it is noted that via structures made with a barrier layer usually have high contact resistance. On the other hand, if the via structures are made to be barrier-free, via to via leakage may occur if two via structures are arranged nearby. In some embodiments of the present disclosure, to further reduce contact resistance and improve device performance, the source side vias (source side power rail) are made with a partially barrier-free bottom surface. Furthermore, the source side vias are made with a barrier layer on sidewalls of the source vias to block via to via leakage path.

FIG. 1 is a top view of a semiconductor device in accordance with some embodiments of the present disclosure. Referring to FIG. 1, the semiconductor device 100 may be an intermediate device fabricated during processing of an integrated circuit, or a portion thereof. In some embodiments, the semiconductor device 100 may comprise static random-access memory (SRAM) and/or other logic circuits, passive components such as resistors, capacitors, and inductors, and active components such as p-type field effect transistors (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. In some embodiments, the semiconductor device 100 may apply to three-dimensional FinFET devices, or to planar FET devices, but the disclosure is not limited thereto. Furthermore, the semiconductor device 100 is not limited to any particular number of devices or device regions, or to any particular device configurations.

As illustrated in FIG. 1, the semiconductor device 100 includes a plurality of fin structures 104 disposed on a substrate (not shown). Furthermore, a plurality of gate structures G1~G16 is disposed on the substrate to intersect with the fin structures 104. For example, the gate structures G1~G16 are extending along a first direction D1, while the fin structures 104 are extending along a second direction D2 perpendicular to the first direction D1. In some embodiments, drain regions 110A and source regions 1101B are disposed over the fin structures 104. The drain regions 110A and source regions 110B are omitted in FIG. 1 for ease of illustration. However, these regions are further illustrated and described in the later figures. In some embodiments, the drain regions 110A and the source regions 110B may include epitaxial layers (or epi-layers) that are epitaxially grown in the active regions (over the fin structures). In certain embodiments, the drain regions 110A and the source regions 110B may be disposed on two opposing sides of the gate structures G1~G16.

In some embodiments, the semiconductor device 100 further includes a plurality of source contacts SC1~SC11, a plurality of drain contacts DC1~DC7, and a plurality of interconnect structures IC1~IC6 disposed over the substrate. The source contacts SC1~SC11, the drain contacts DC1-DC7 and the interconnect structures IC1~IC6 are extending along the first direction D1 and disposed in parallel with the gate structures G1~G16. In some embodiments, the source contacts SC1~SC11 are disposed on the source regions 110B (not shown), while the drain contacts DC1~DC7 are disposed over the drain regions 110A (not shown). In some embodiments, the interconnect structures IC1~IC6 may be connected to drain contacts or source contacts located in other regions of the semiconductor device 100.

As illustrated in FIG. 1, in some embodiments, the source contact SC1 and the drain contact DC1 are disposed in between the gate structure G1 and the gate structure G3. The source contact SC2 and the interconnect structure IC1 are disposed in between the gate structure G2 and the gate structure G4. The drain contact DC2 and the source contact SC3 are disposed in between the gate structure G3 and the gate structure G5. The drain contact DC3 and the source contact SC4 are disposed in between the gate structure G4 and the gate structure G6. The drain contact DC4 is disposed in between the gate structure G5 and the gate structure G7. The interconnect structure IC2 is disposed in between the gate structure G6 and the gate structure G8. The interconnect structure IC3 is disposed in between the gate structure G7 and the gate structure G9. The source contact SC5 is disposed in between the gate structure G8 and the gate structure G10. The interconnect structure IC4 and the source contact SC6 are disposed in between the gate structure G9 and the gate structure G11. The interconnect structure IC5 is disposed in between the gate structure G10 and the gate structure G12. The interconnect structure IC6 is disposed in between the gate structure G11 and the gate structure G13. The source contact SC7 is disposed in between the gate structure G12 and the gate structure G14. The drain contact DC5 and the source contact SC8 are disposed in between the gate structure G13 and the gate structure G15. The drain contact DC6 and the source contact SC9 are disposed in between the gate structure G14 and the gate structure G16. The source contact SC10 and the drain contact DC7 are disposed on another side of the gate structure G15, opposite to the drain contact DC5 and the source contact SC8. Furthermore, the source contact SC11 is disposed on another side of the gate structure G16, opposite to the drain contact DC6 and the source contact SC9.

Moreover, the semiconductor device 100 further comprises a plurality of source vias SV1~SV11 disposed on the source contacts SC1~SC11 and a plurality of drain vias DV1~DV7 disposed on the drain contacts DC1~DC7. In the exemplary embodiment, each of the source vias SV1~SV11 are disposed on and connected to each of the source contacts SC1~SC11. In some embodiments, each of the source vias SV1~SV11 includes a body portion and a barrier layer surrounding the body portion (not shown), whereby the body portion is in physical contact with the respective source contacts SC1~SC11. In some embodiments, the body portion of the source vias SV1~SV11 has an overlapping portion (SV1-A, SV2-A, SV3-A, SV4-A, SV5-A, SV6-A, SV7-A, SV8-A, SV9-A, SV10-A, SV11-A) and a non-overlapping portion (SV1-B, SV2-B, SV3-B, SV4-B, SV5-B, SV6-B, SV7-B, SV8-B, SV9-B, SV10-B, SV11-B). For example, the overlapping portions SV1-A~SV11-A are overlapped with and connected to the respective source contacts SC1~SC11, while the non-overlapping portions SV1-B~SV11-B are extending from the overlapping portions SV1-A~SV11-A, and non-overlapped with the source contacts SC1~SC11. In some embodiments, the source vias SV1~SV11 has a quadrilateral-shape, such as a square shape or rectangular shape. However, the disclosure is not limited thereto, and the shapes of the source vias SV1~SV11 may be adjusted based on design requirements.

In some embodiments, each of the drain vias DV1~DV7 are disposed on and connected to each of the drain contacts DC1~DC7. The drain vias DV1~DV7 may include a barrier-less body portion. In other words, the drain vias DV1~DV7 are vias without a barrier layer. In the exemplary embodiment, a length (or width) of the source vias SV1~SV11 extending in the first direction D1 is greater than a length (or width) of the drain vias DV1~DV7 extending in the first direction D1. Furthermore, a length (or width) of the source vias SV5~SV7, SV10~SV11 extending in the second direction D2 is greater than a length (or width) of the drain vias DV1~DV7 extending in the second direction D2. In some embodiments, a top surface area of all the source vias SV1~SV11 is greater than the top surface area of all the drain vias DV1~DV7. Furthermore, a source contact surface area (landing surface) of the source vias SV1~SV11 to the respective source contacts SC1~SC1 is greater than a drain contact surface area of the drain vias DV1~DV7 to the respective drain contacts DC1~DC7.

As further illustrated in FIG. 1, metal lines ML1 are disposed on and connected to the drain vias DV1~DV7, while metal lines ML2 are disposed on and connected to the source vias SV1~SV11. For example, a metal line ML1 is connected to the drain vias DV2, DV4 and DV5 located in the same row along the second direction DR2, another metal line ML1 is connected to the drain vias DV1 and DV7 located in the same row along the second direction DR2, while a further metal line ML1 is connected to the drain vias DV3, DV6 located in the same row along the second direction DR2. Similarly, a metal line ML2 is connected to the source vias SV1, SV3, SV6, SV8 and SV10 located in the same row along the second direction DR2, while another metal line ML2 is connected to the source vias SV2, SV2, SV5, SV7, SV9 and SV11 located in the same row along the second direction DR2. In the exemplary embodiment, a width of the metal line ML2 measured along the first direction D1 is greater than a width of the first metal line ML1 measured along the first direction D1.

In the semiconductor device 100, by designing the source vias SV1~SV11 to include a body portion and a barrier layer surrounding the body portion, whereby the body portion is in physical contact with the respective source contact SC1~SC11, the contact resistance may be reduced and the via to via leakage may be prevented. The method of fabricating the semiconductor device 100 will be described in more detail by referring to FIG. 2A to FIG. 9B.

FIG. 2A to FIG. 9B are schematic sectional views of various stages in a method of fabricating a semiconductor device in accordance with some embodiments of the present disclosure. FIG. 2A, FIG. 3A, FIG. 4A, FIG. 5A, FIG. 6A, FIG. 7A, FIG. 8A and FIG. 9A respectively illustrates a cross section taken along the lines A-A' of FIG. 1 at various stages of fabricating the semiconductor device 100. Furthermore, FIG. 2B, FIG. 3B, FIG. 4B, FIG. 5B, FIG. 6B, FIG. 7B, FIG. 8B and FIG. 9B respectively illustrates a cross section taken along the lines B-B' of FIG. 1 at various stages of fabricating the semiconductor device 100.

Figure 2B:
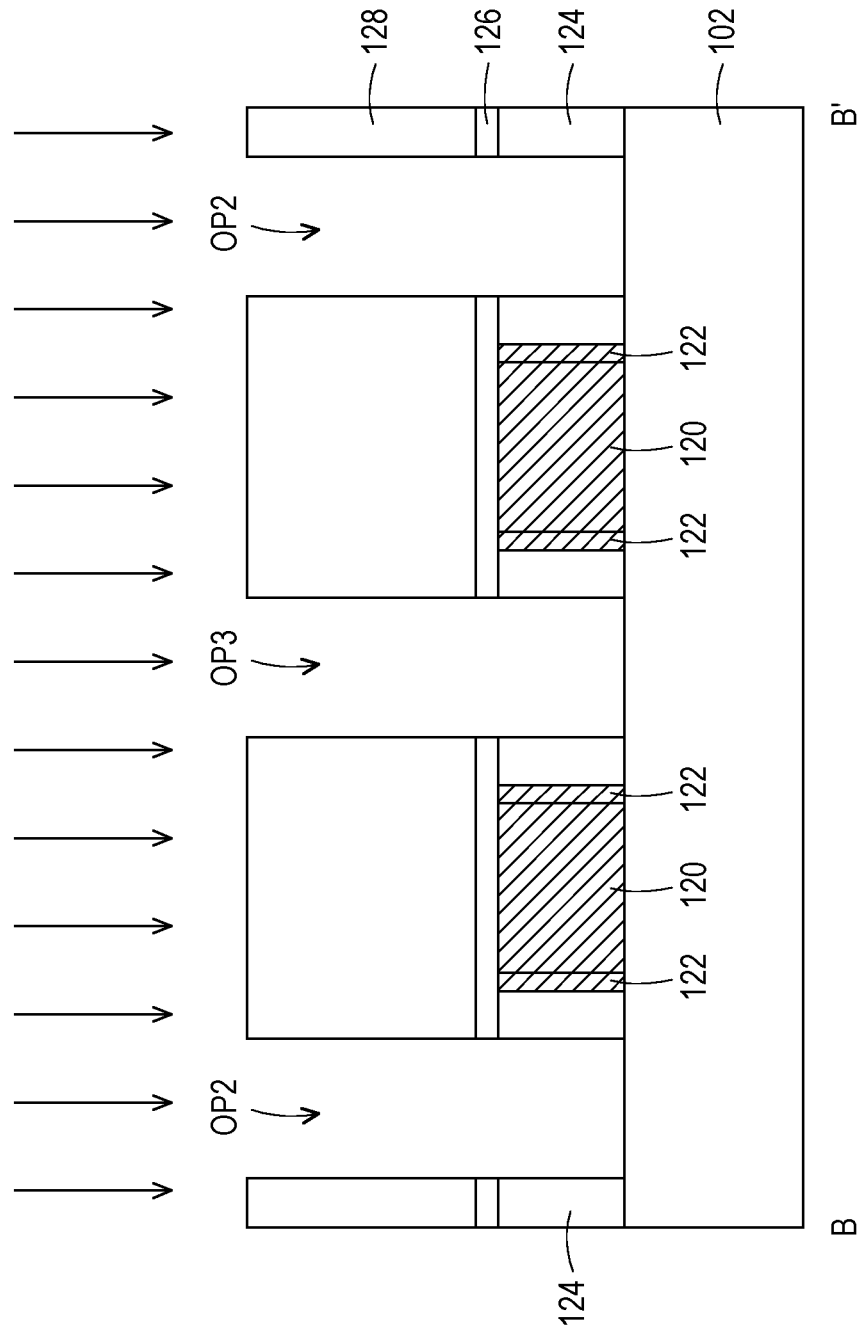

Referring to FIG. 2A and FIG. 2B, an initial structure of the semiconductor device 100 is provided. The initial structure includes a substrate 102. The substrate 102 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for semiconductor device manufacturing. In some embodiments, the substrate 102 may be a silicon-on-insulator (SOI) substrate having a semiconductor silicon layer formed on a silicon oxide layer. In another embodiment, the substrate 102 may include a conductive layer, a semiconductor layer, a dielectric layer, other layers, or combinations thereof. As indicated above, various doped regions may be formed in or on the substrate 102. The doped regions may be doped with n-type dopants, such as phosphorus or arsenic, and/or p-type dopants, such as boron or indium, depending on design requirements. The doped regions may be formed directly on the substrate 102, in a p-well structure, in an n-well structure, in a dual-well structure, or using a raised structure. Doped regions may be formed by implantation of dopant atoms, in-situ doped epitaxial growth, and/or other suitable techniques.

As illustrated in FIG. 2A and FIG. 2B, fin structures 104 (or active structures) are disposed on the substrate 102. The fin structures 104 may be fabricated using suitable processes including photolithography and etching processes. The photolithography process may include forming a photoresist layer overlying the substrate 102, exposing the photoresist to a pattern, performing post-exposure bake processes, and developing the photoresist to form a masking structure (not shown) including the resist. The masking structure is then used for etching recesses into the substrate 102, leaving the fin structures 104 on the substrate 102. The etching process may include dry etching, wet etching, reactive ion etching (RIE), and/or other suitable processes. In some embodiments, the fin structure 104 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

In some embodiments, isolation structures 106 are formed over the substrate to surround the fin structures 104. In some embodiments, the isolation structures 106 electrically separate various components of the semiconductor device 100. The isolation structures 106 may include silicon oxide, silicon nitride, silicon oxynitride, fluoride-doped silicate glass (FSG), a low-k dielectric material, and/or other suitable materials. In some embodiments, the isolation structures 106 may include shallow trench isolation (STI) features. In one embodiment, the isolation structures 106 are formed by etching trenches in the substrate 102 during the formation of the fin structures 104. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 106. Alternatively, the isolation structures 106 may include a multi-layer structure, for example, having one or more thermal oxide liner layers.

In some embodiments, gate structures 120 (corresponding to gate structures G1~G16 shown in FIG. 1) are disposed on the substrate 102 and over the fin structures 104. The gate structures 120 may be high-k metal gate (HKMG) stacks that contain a high-k gate dielectric and a metal gate electrode, where the HKMG structures are formed by replacing dummy gate structures. In some embodiments, spacers layers 122 may be located on the substrate 102 aside the gate structures 120. For example, the spacers layers 122 may include silicon nitride (SiN), a low-k material, or the like.

In some embodiment, the drain region 110A is disposed over the fin structures 104. Furthermore, in another region of the substrate 102 (not shown), source regions 110B may be disposed over other fin structures 104. The source regions 110B and drain regions 110A are formed over the recessed fin structures 104 by any suitable methods, such as epitaxial growth methods, or the like. In some embodiments, the source regions 110B and/or drain regions 110A are formed over (or "merges over") two recessed fin structures 104. However, the disclosure is not limited thereto, and the source regions 110B and/or drain regions 110A may be formed over one of the recessed fin structures 104.

In some embodiments, a dielectric layer 124 is formed on the substrate 102 to surround the gate structures 120 and the spacers layers 122. An etch-stop layer 126 is formed on the dielectric layer 124, and an interlayer dielectric 128 is formed on the etch-stop layer 126. The etch-stop layer 126 may be a silicon nitride (SiN) layer, or other suitable materials for protecting the underlying layers from etching processes. In some embodiments, the dielectric layer 124 and the interlayer dielectric 128 shown in FIG. 2B may correspond to the dielectric layer 108 shown in FIG. 2A. For example, the dielectric layer 108 may surround a top portion of the fin structures 104, and surround the source regions 110B and the drain regions 110A. In certain embodiments, the dielectric layer 124 and the interlayer dielectric 128 (or dielectric layer 108) may include any suitable materials, such as silicon oxides, SiCN, SiOCN, SiON, metal oxides, or combinations thereof.

As further illustrated in FIG. 2A and FIG. 2B, the dielectric layer 124 and the interlayer dielectric 128 (or dielectric layer 108) are patterned or etched to form openings OP1, openings OP2 and openings OP3. In some embodiments, a position of the openings OP1 corresponds to a position of the drain contacts DC1~DC7 formed in a subsequent step, and the openings OP1 may reveal the drain regions 110A located underneath. In some embodiments, a position of the openings OP2 corresponds to a position of the source contacts SC1~SC11 formed in a subsequent step, and the openings OP2 may reveal the source regions 1101B (not shown) located underneath. Furthermore, a position of the openings OP3 corresponds to a position of the interconnect structures IC1~IC6 formed in a subsequent step.

Figure 3A:
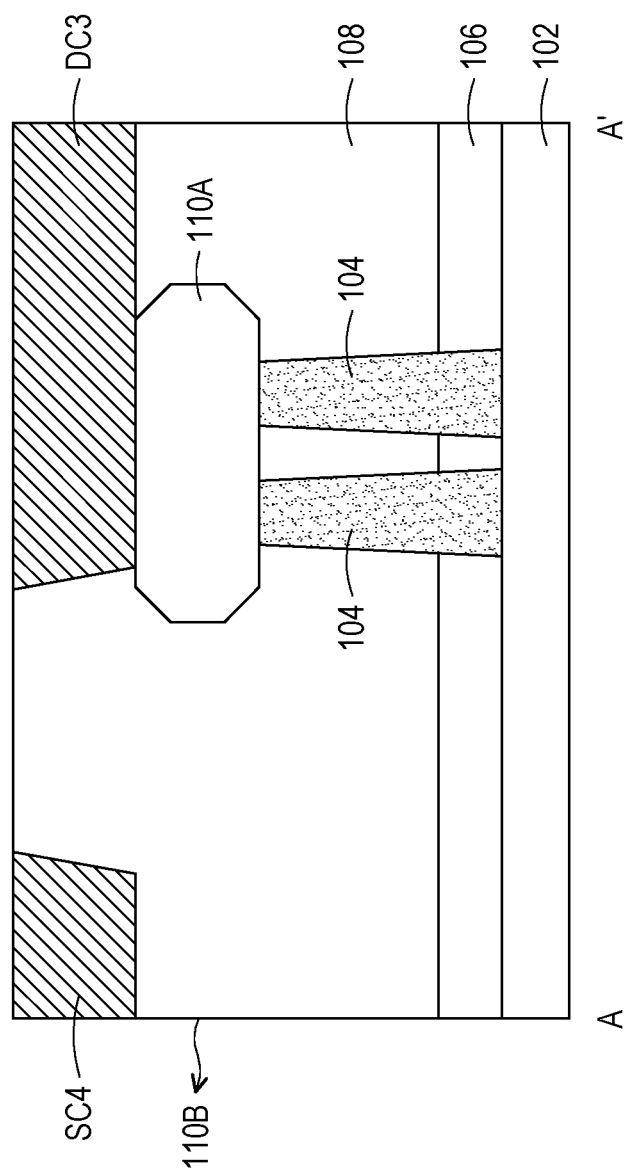
Figure 3B:
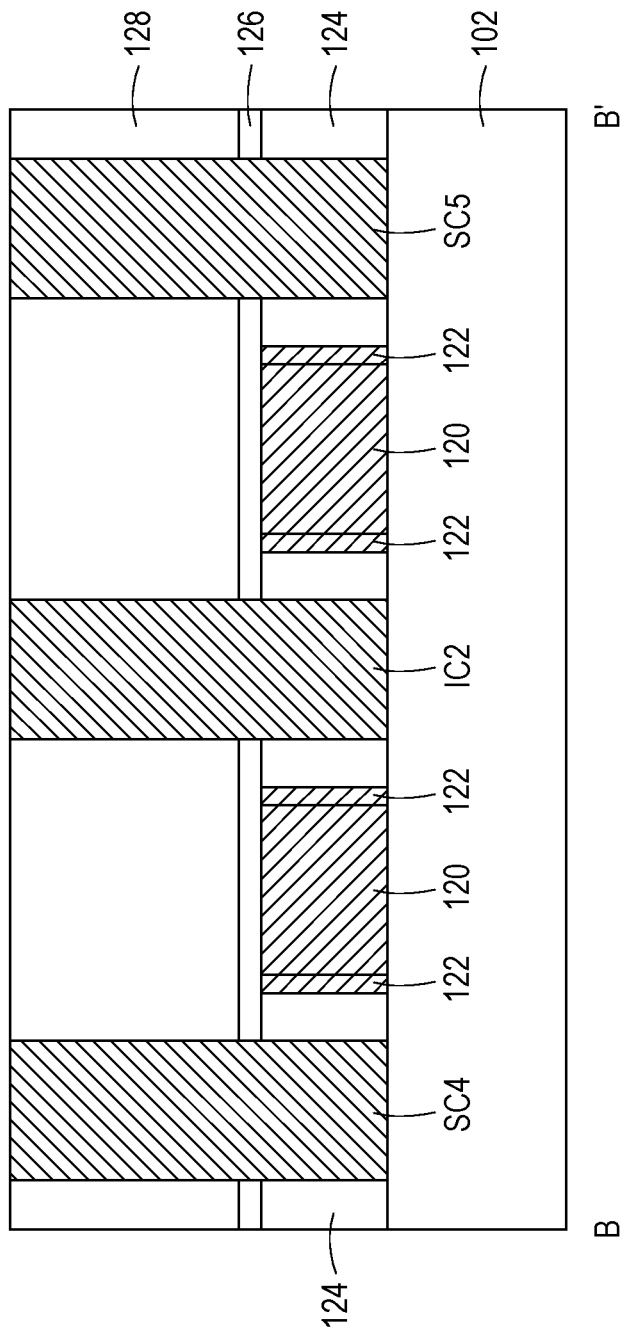

Referring to FIG. 3A to FIG. 3B, in a subsequent step, drain contacts DC1~DC7 (DC3 as shown in FIG. 3A) are formed in the openings OP1, source contacts SC1~SC11 (SC4, SC5 shown in FIG. 3A and FIG. 3B) are formed in the openings OP2 and interconnect structures IC1~IC6 (IC2 shown in FIG. 3B) are formed in the openings OP3. For example, the drain contacts DC1~DC7, source contacts SC1~SC11 and the interconnect structures IC1~IC6 are formed by depositing a metallic material in the openings in one single deposition process. In some other embodiments, the drain contacts DC1~DC7, source contacts SC1~SC11 and the interconnect structures IC1~IC6 are formed in sequential deposition processes. A planarization process, such as a chemical mechanical planarization (CMP) process may be performed to remove excess metallic material so that the top surfaces of the drain contacts DC1~DC7, the source contacts SC1~SC11 and the interconnect structures IC1~IC6 are substantially coplanar and aligned with one another. Furthermore, after the planarization process, the top surface of the interlayer dielectric 128 (or dielectric layer 108) are aligned with the top surfaces of the drain contacts DC1~DC7, the source contacts SC1~SC11 and the interconnect structures IC1~IC6.

Figure 4A:
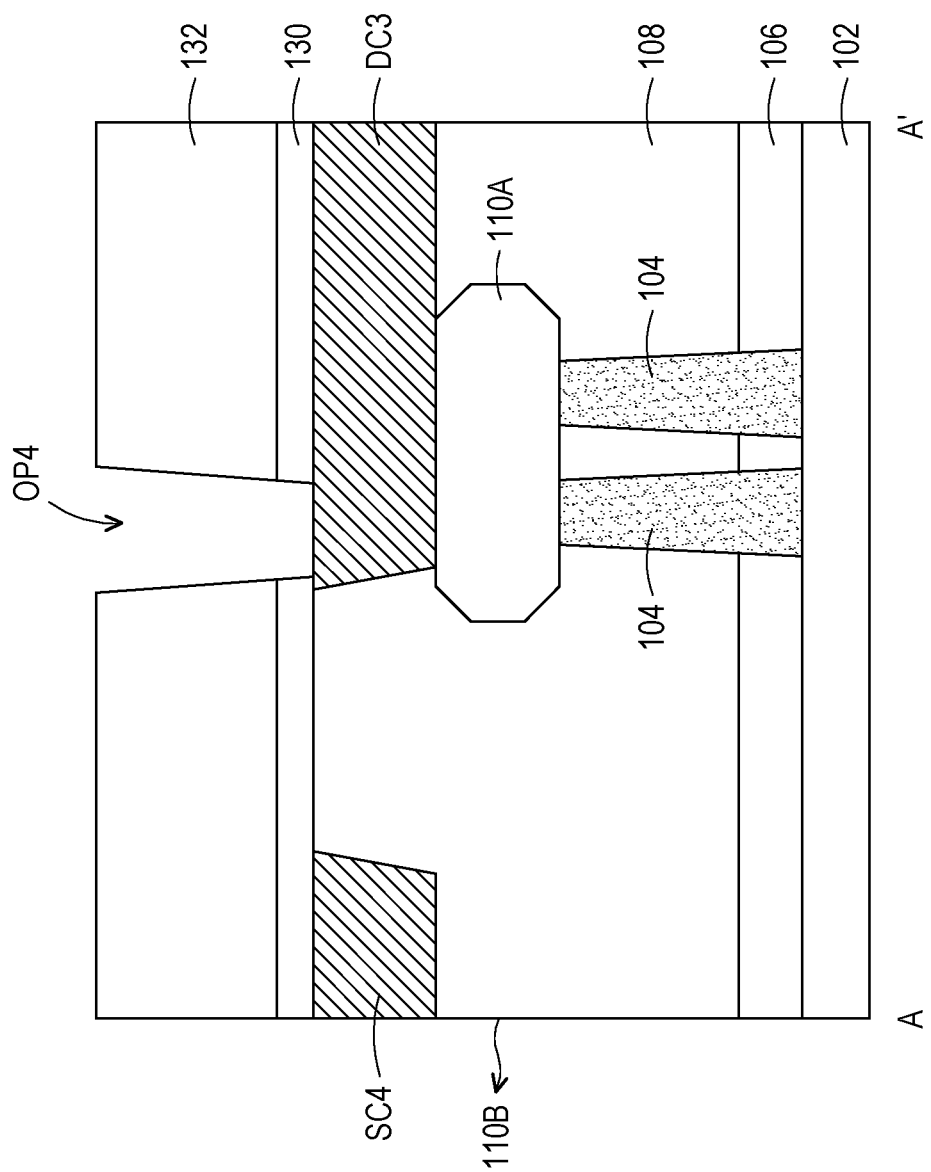
Figure 4B:
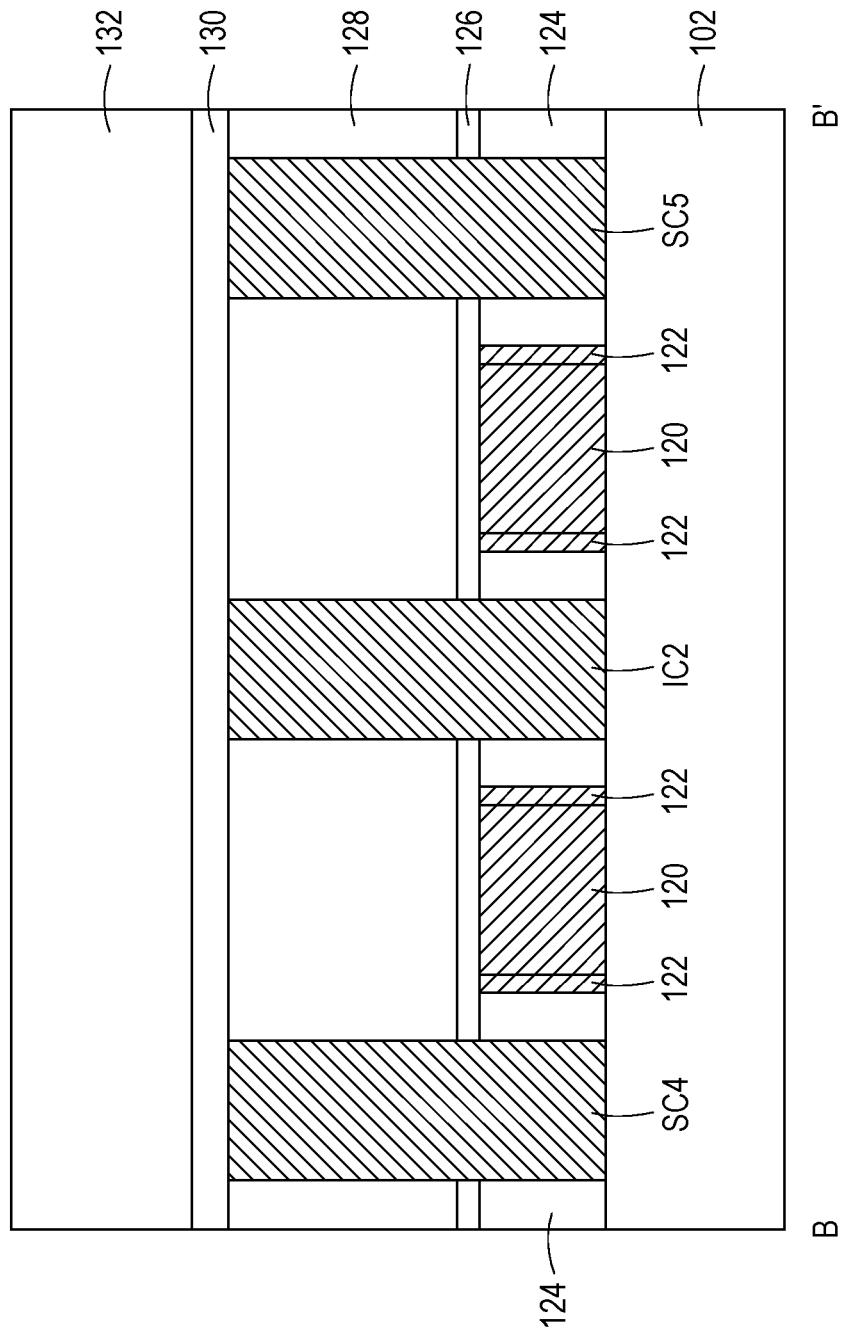

Referring to FIG. 4A and FIG. 4B, in a subsequent step, an etch-stop layer 130 is formed over the interlayer dielectric 128 (or dielectric layer 108) to cover the drain contacts DC1~DC7, the source contacts SC1~SC11 and the interconnect structures IC1~IC6. The etch-stop layer 130 may be a silicon nitride (SiN) layer, or other suitable materials for protecting the underlying layers from etching processes. In some embodiments, an interlayer dielectric 132 (or dielectric layer) is formed over the top surface of the etch-stop layer 130. For example, the interlayer dielectric 132 may include any suitable materials, such as silicon oxides, SiCN, SiOCN, SiON, metal oxides, or combinations thereof.

Subsequently, the interlayer dielectric 132 is patterned and portions of the etch-stop layer 130 are removed to form the openings OP4. The openings OP4 may be formed by any suitable methods. For example, in some embodiments, a patterned photoresist layer may be formed over the interlayer dielectric 132, whereby the patterned photoresist layer reveals portions of the interlayer dielectric 132. The patterned photoresist layer may be formed by lithography process that includes photoresist coating, exposure to ultraviolet (UV) radiation, and developing process. A hard mask, such as silicon nitride, or other suitable material, may be further used. In some embodiments, the openings of the patterned photoresist layer are first transferred to the hard mask by etching. Thereafter, an etching process, such as dry etching, wet etching or a combination thereof, is conducted to remove the exposed portions of the interlayer dielectric 132 to form the openings OP4. In some embodiments, the openings OP4 reveal the top surfaces of the drain contacts DC1~DC7.

Figure 5A:
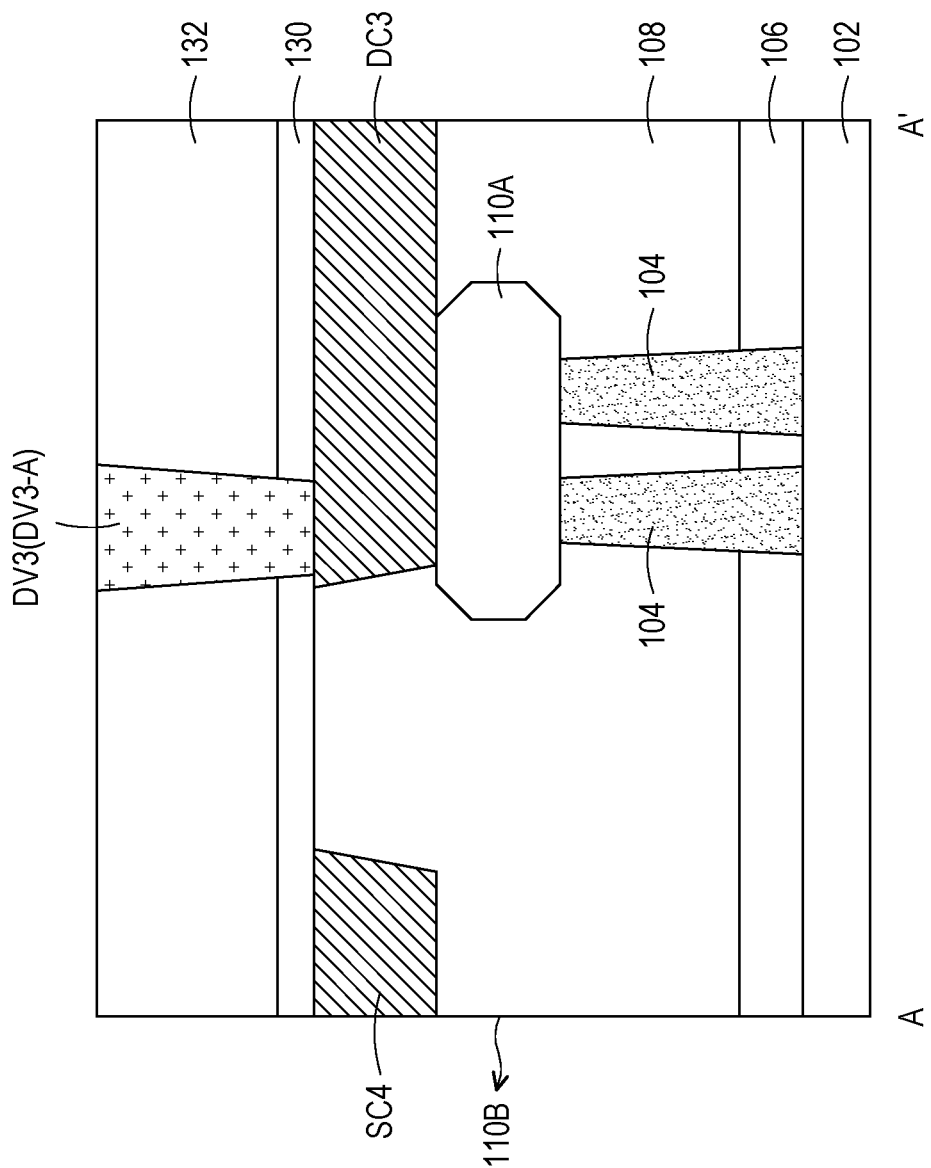
Figure 5B:
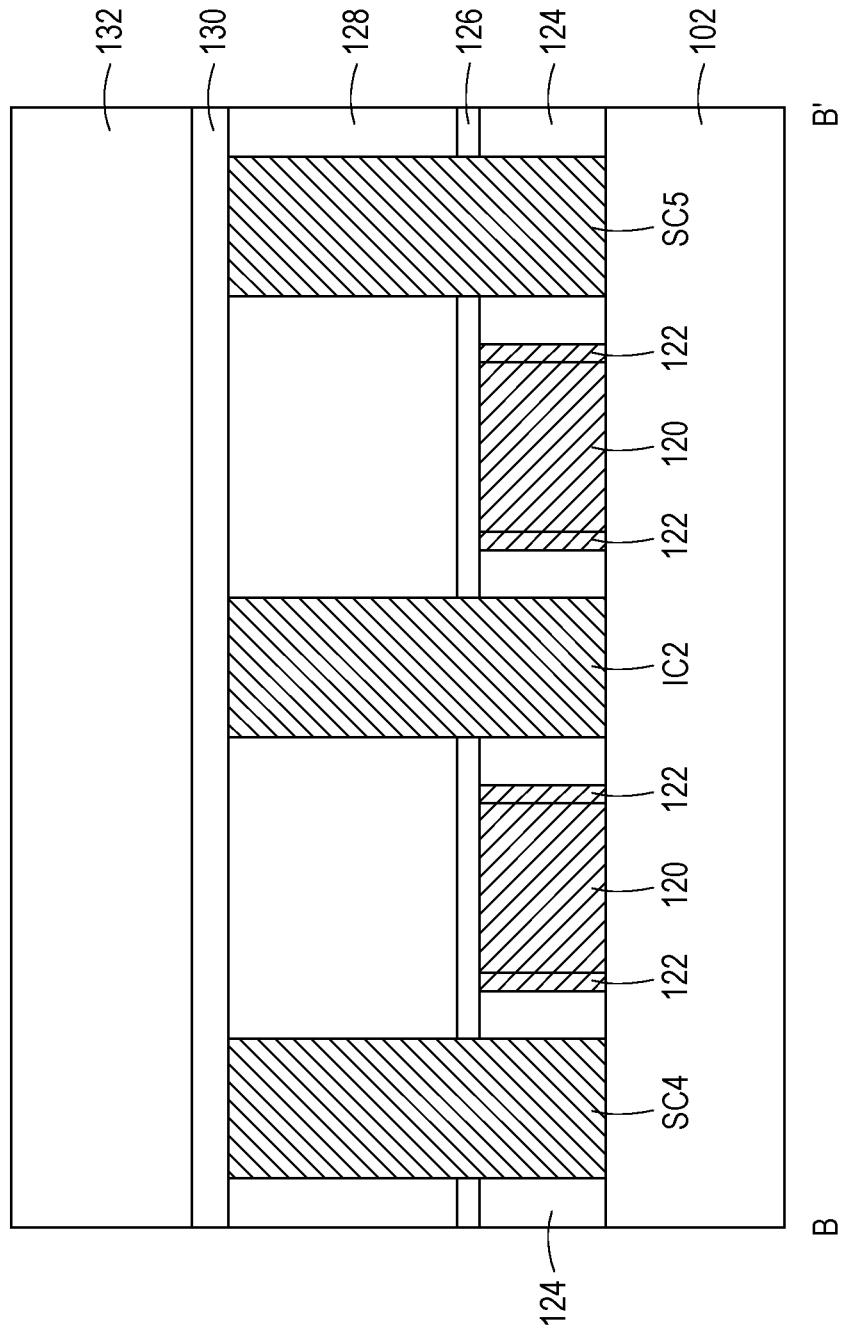

Referring to FIG. 5A and FIG. 5B, after forming the openings OP4, the drain vias DV1~DV7 are formed in the openings OP4. A bottom-up process is performed for depositing the drain vias DV1~DV7 in the openings OP4. In some embodiments, a chemical vapor deposition (CVD) method, an atomic layer deposition (ALD) method or the like may be used for depositing the drain vias DV1~DV7. For example, a material of the drain vias DV1~DV7 may be cobalt (Co), ruthenium (Ru), copper (Cu), tantalum (Ta), titanium (Ti), iridium (Ir), tungsten (W), aluminum (Al), tantalum nitride (TaN), or other suitable metals. In certain embodiments, a material of the drain vias DV1~DV7 are tungsten (W). In some embodiments, the drain vias DV1~DV7 respectively includes a barrier-less body portion. For example, as illustrated in FIG. 5A, the drain via DV3 includes a barrier-less body portion DV3-A. In other words, the drain vias DV1~DV7 are vias made without a barrier layer.

Figure 6A:
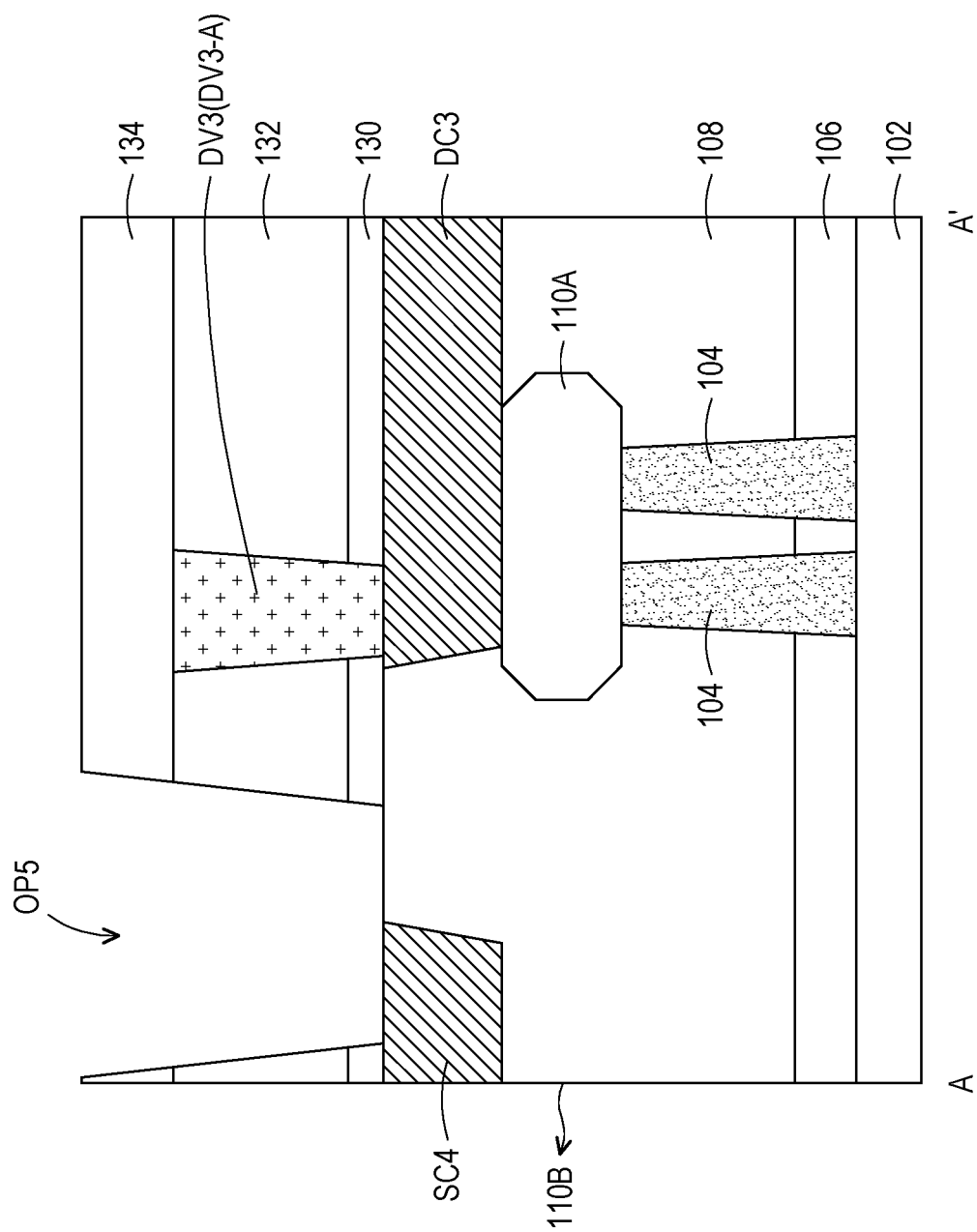
Figure 6B:
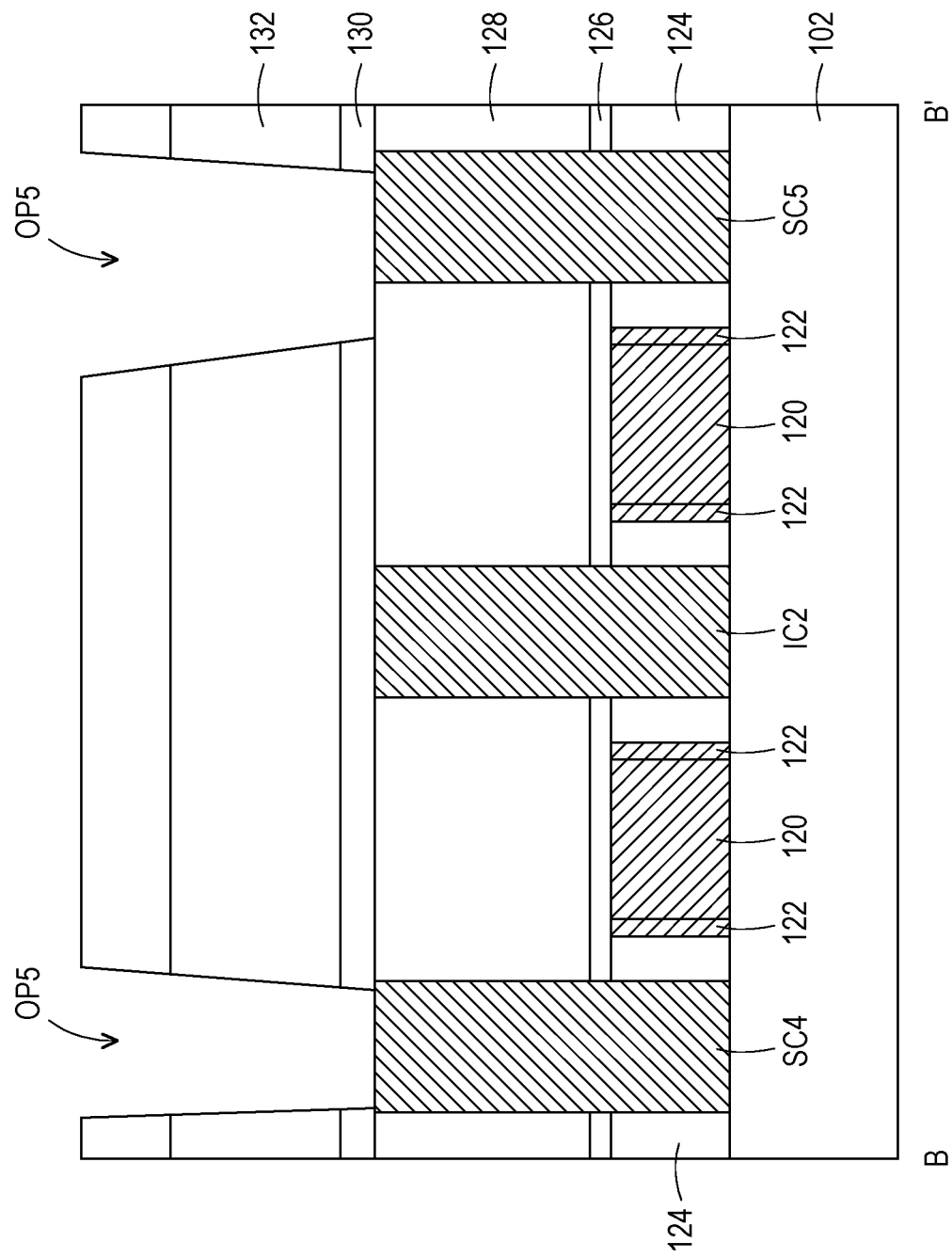

Referring to FIG. 6A to FIG. 6B, in a subsequent step, an interlayer dielectric 134 is formed over the interlayer dielectric 132. For example, the interlayer dielectric 134 may include any suitable materials, such as silicon oxides, SiCN, SiOCN, SiON, metal oxides, or combinations thereof. In some embodiments, the interlayer dielectrics 132, 134 may be patterned and portions of the etch-stop layer 130 is removed to form the openings OP5. The openings OP5 may be formed by any suitable methods similar to that of forming the openings OP4, thus its details will not be repeated herein. In some embodiments, the openings OP5 reveals portion of the top surfaces of the source contacts SC1~SC11 located underneath. In certain embodiments, the width or length of the openings OP5 along the first direction D1 and the second direction D2 (as shown in FIG. 1) are greater than the width or length of the openings OP4 along the first direction D1 and the second direction D2.

Figure 7A:
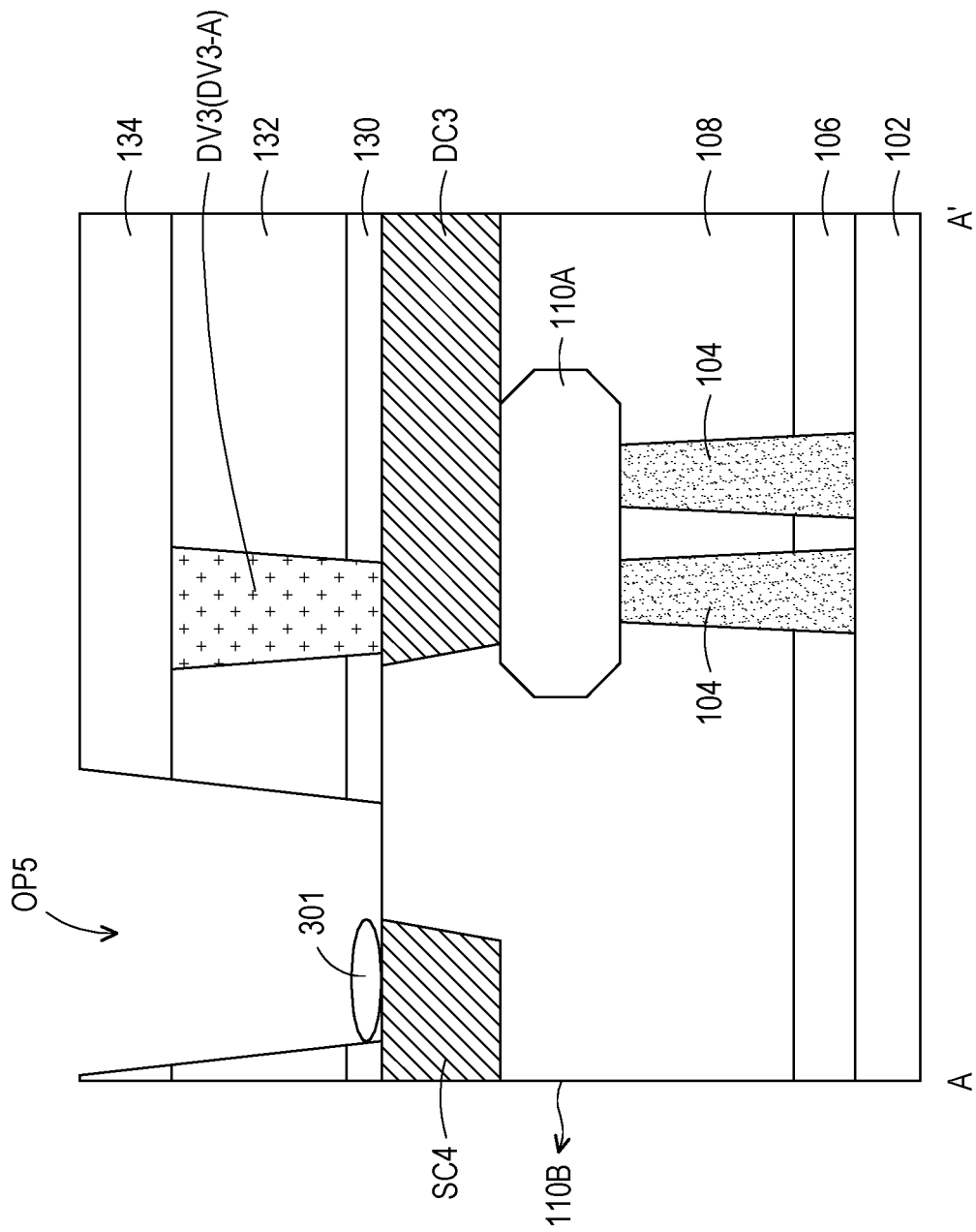
Figure 7B:
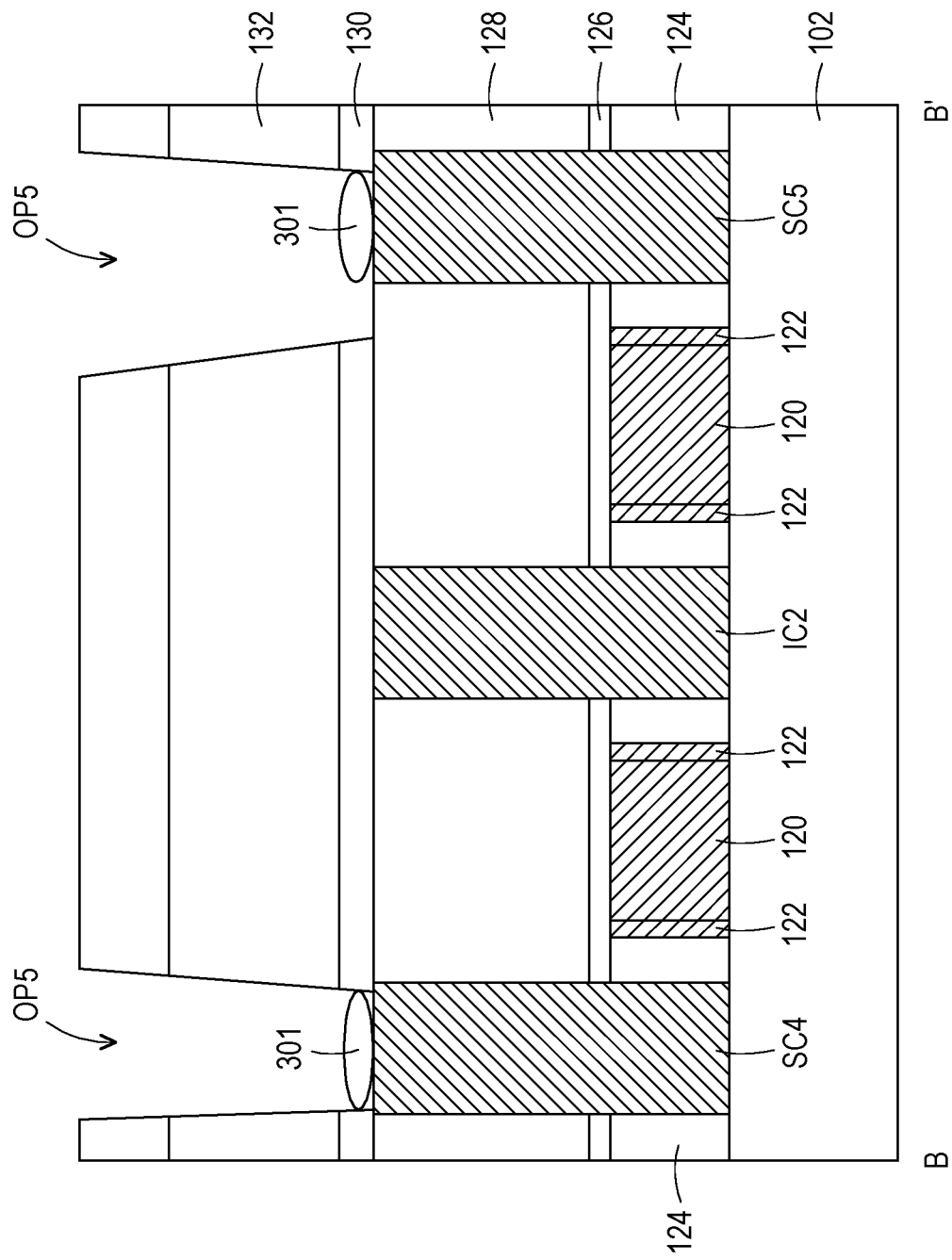

Referring to FIG. 7A to FIG. 7B, after forming the openings OP5, a blocking layer 301 is formed in the openings OP5 to cover the respective source contacts SC1~SC11. In some embodiments, the blocking layer 301 is a material that can be selectively grown on the metal surface of the source contacts SC1~SC11. In other words, the blocking layer 301 is formed to cover the source contacts SC1~SC11, while the interlayer dielectric 128 (or dielectric layer 108) is exposed by the openings OP5. In the illustrated embodiment, the blocking layer 301 is formed over the source contacts SC4, SC5 to cover the top surfaces of the source contacts SC4, SC5, while revealing the interlayer dielectric 128 (or dielectric layer 108). In some embodiments, a material of the blocking layer 301 is EPOL8, or the like. EPOL8 is for example, a bottom anti-reflective coating (BARC) film including carbon (C), oxide (O), hydrogen (H), fluorine (F), nitrogen (N), silicon (Si) elements, and less of metal elements such as lead (Pb), copper (Cu), aluminum (Al), tungsten (W), titanium (Ti). EPOL8 has the characteristics of good adhesion and selective growth on metal surfaces, while EPOL8 does not grow on dielectric films or silicon oxide films. However, the disclosure is not limited thereto, and any material that can selectively block the source contacts SC1~SC11 can be used as the blocking layer 301.

Figure 8A:
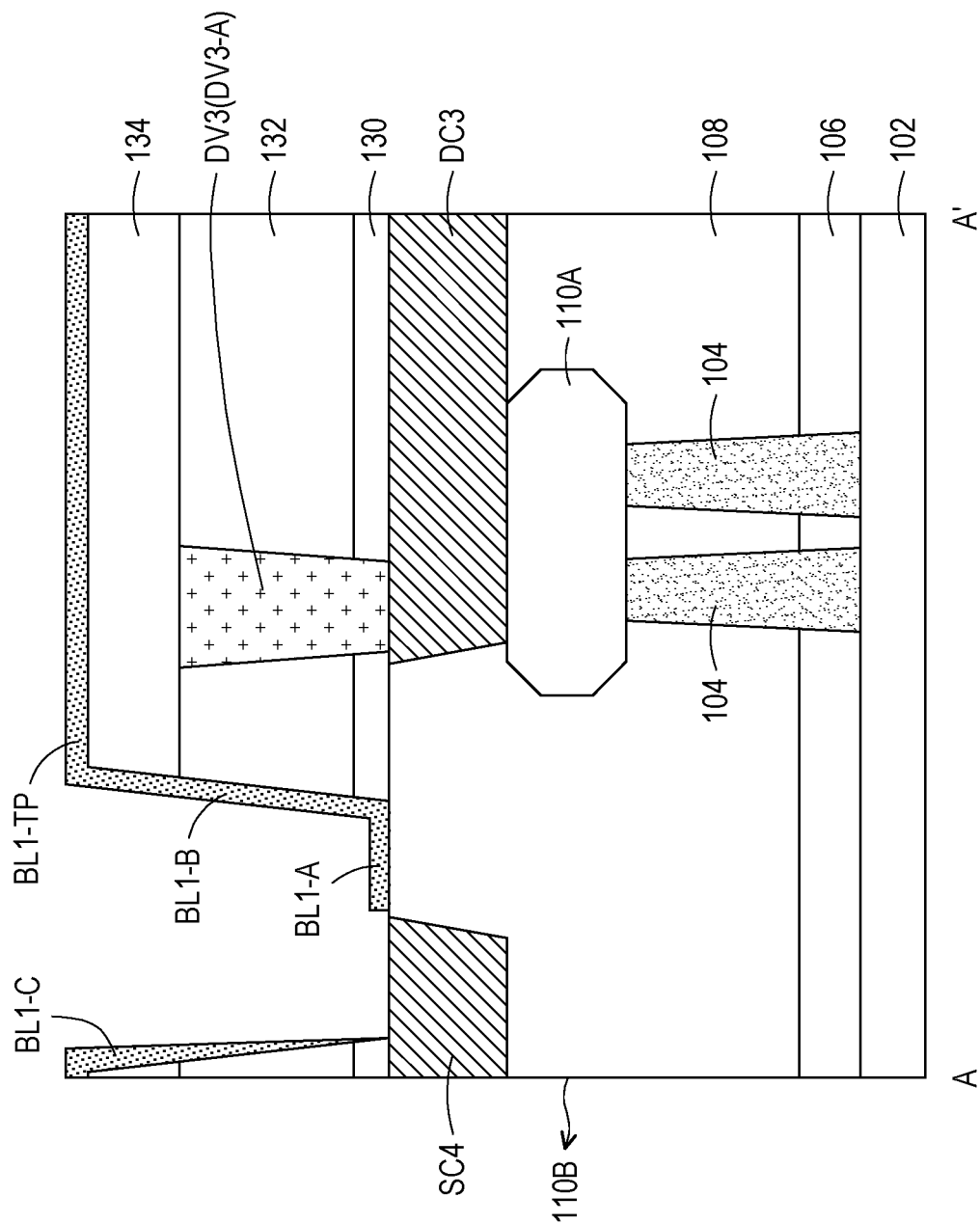
Figure 8B:
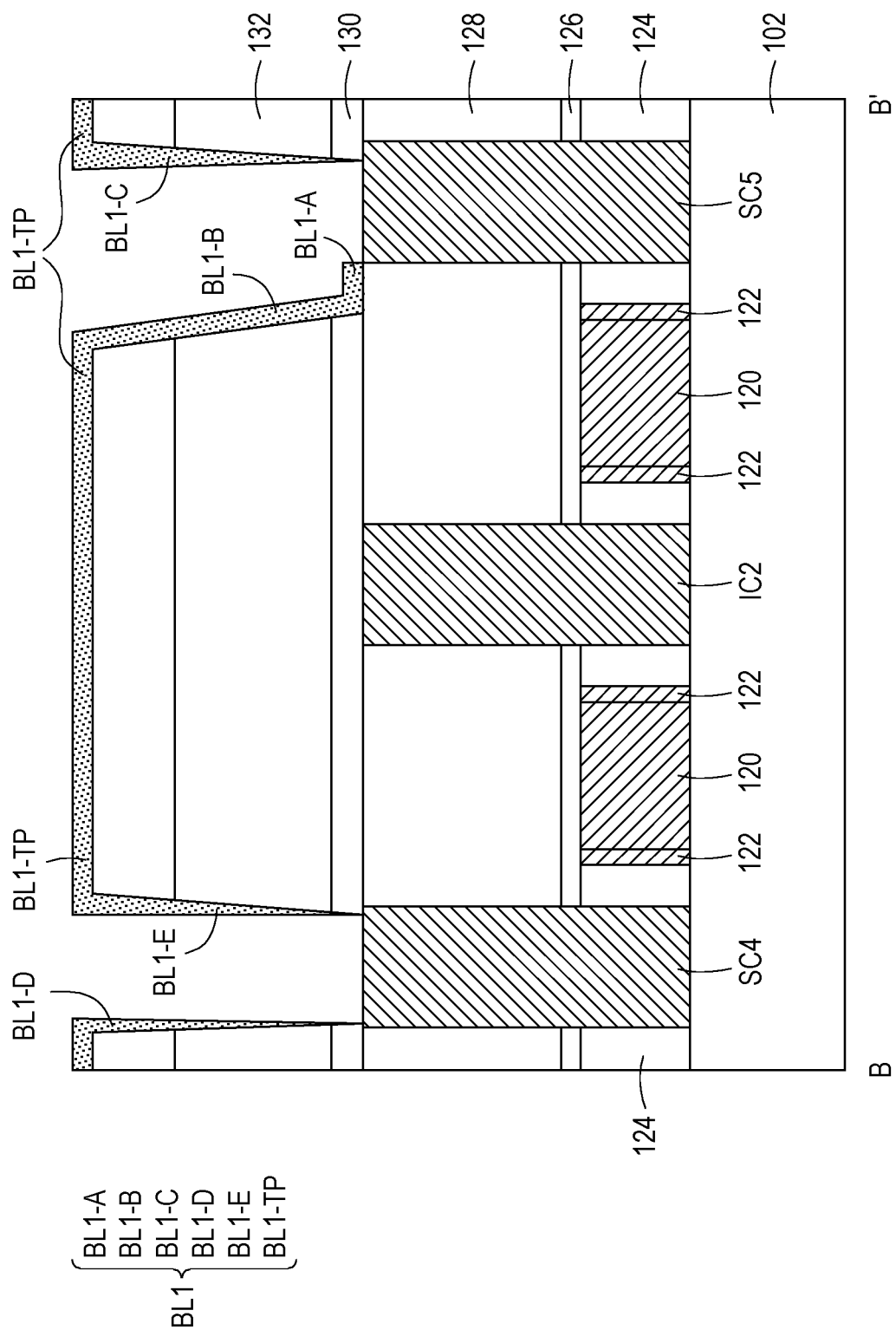

Referring to FIG. 8A to FIG. 8B, in a subsequent step, a barrier layer BL1 is formed in the openings OP5 and over the interlayer dielectric 134. For example, the barrier layer BL1 is formed in the openings OP5 over regions not covered by the blocking layer 301. In some embodiments, the barrier layer BL1 is formed with a bottom section BL1-A, a sidewall section BL1-B, a sidewall section BL1-C, a sidewall section BL1-C, a sidewall section BL1-D and a top section BL1-TP. The bottom section BL1-A partially covers a bottom surface of the openings OP5. For example, the bottom section BL1-A covers the interlayer dielectric 128 (or dielectric layer 108), while revealing the source contacts SC1~SC11. In some embodiments, the sidewall sections BL1-B, BL1-C, BL1-D and BL1-E respectively covers a sidewall of the openings OP5. Furthermore, the top section BL1-TP covers a top surface of the interlayer dielectric 134. In the exemplary embodiment, the bottom section BL1-A, the sidewall section BL1-B, and the top section BL1-TP has a constant width in the openings OP5 and over the interlayer dielectric 134. In certain embodiments, the sidewall sections BL1-C, BL1-D, BL1-E has a width that reduces from the top of the openings OP5 to the bottom of the openings OP5. After forming the barrier layer BL1, the blocking layer 301 is then removed, and the source contacts SC1~SC11 are exposed.

Figure 9A:
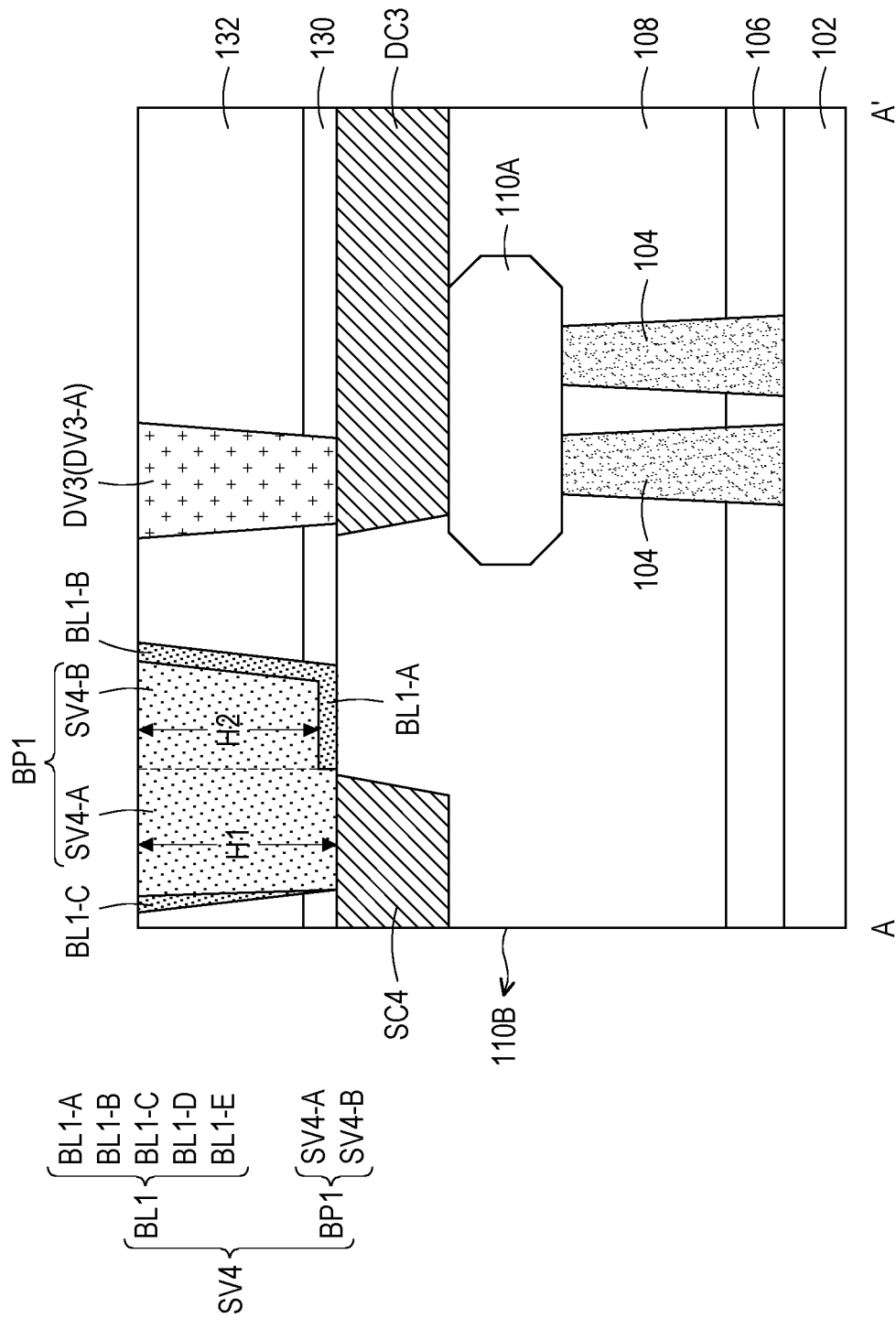
Figure 9B:
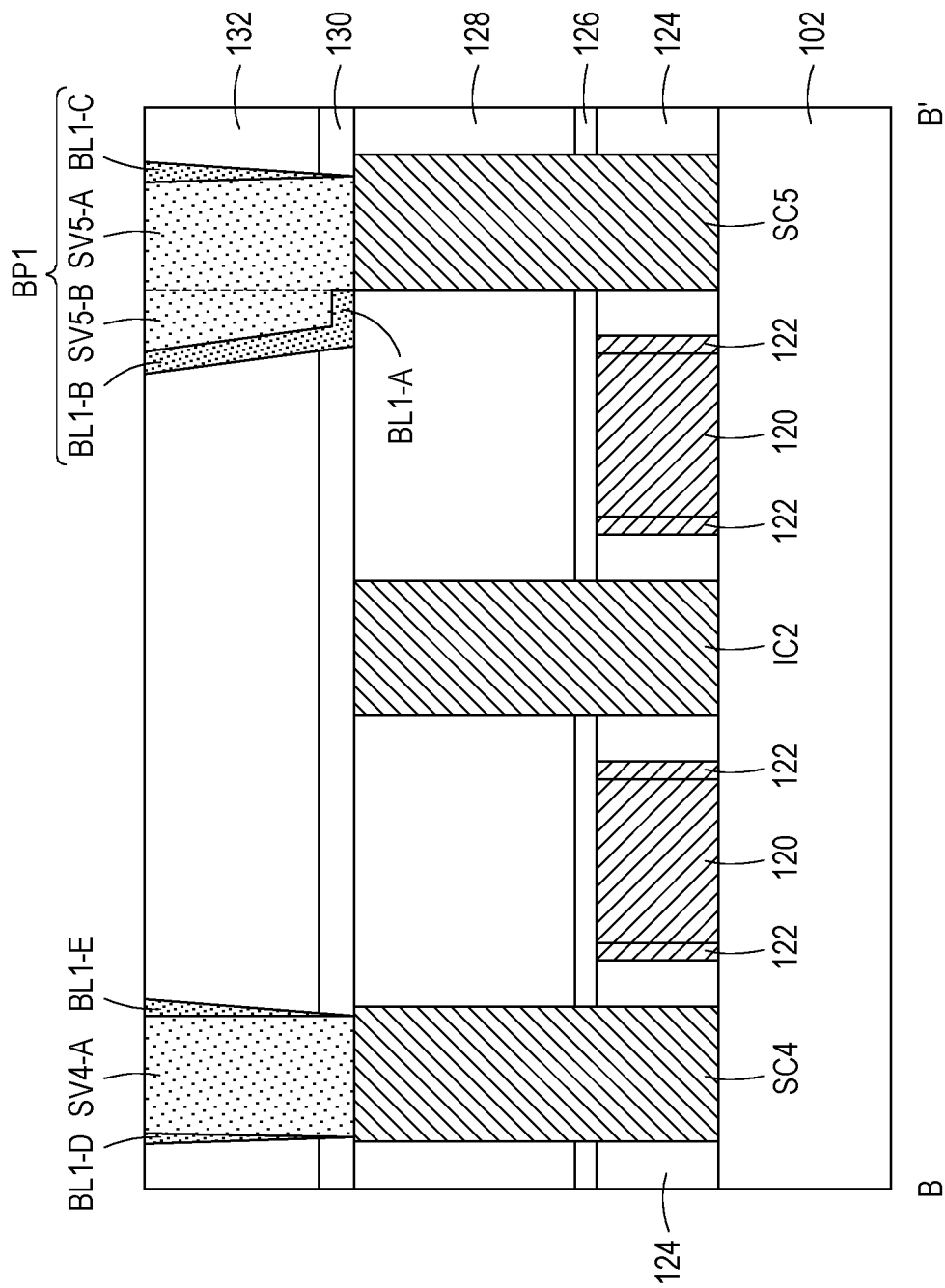

Referring to FIG. 9A to FIG. 9B, after forming the barrier layer BL1, a body portion BP1 is filled in the opening OP5 to complete the formation of the source vias SV1~SV11. In the exemplary embodiment, a planarization process, such as a chemical mechanical planarization (CMP) process may be performed to remove excess metallic material so that the top surfaces of the source vias SV1~SV11, top surfaces of the drain vias DV1~DV7 and a top surface of the interlayer dielectric 132 are substantially aligned and coplanar with one another. As illustrated in FIG. 9A to FIG. 9B, the source vias SV1~SV11 are respectively formed with a body portion BP1 and a barrier layer BL1 surrounding the body portion BP1. In some embodiments, the barrier layer BL1 includes a titanium (Ti)/titanium nitride (TiN) layer, while the body portion BP1 may be made of the same materials as the drain vias DV1~DV7

In some embodiments, the body portion BP1 of the source vias SV1~SV11 includes an overlapping portion SV1-A~SV11-A (SV4-A, SV5-A as shown in FIGS. 9A-9B) and a non-overlapping portion SV1-B~SV11-B (SV4-B, SV5-B as shown in FIGS. 9A-9B). The overlapping portions SV1-A~SV11-A includes a first body portion with a height of H1, while the non-overlapping portions SV1-B~SV11-B includes a second body portion with a height of H2. For example, the height H1 of the first body portion (SV1-A~SV11-A) is greater than the height H2 of the second body portion (SV1-B~SV11-B), and the first body portion (SV1-A~SV11-A) is in physical contact with the respective source contacts SC1~SC11.

In the exemplary embodiment, the sidewall sections BL1-B, BL1-C, BL1-D and BL1-E of the barrier layer BL1 respectively covers four sidewall surfaces of the body portion BP1. Furthermore, the bottom section BL1-A partially covers a bottom surface of the body portion BP1. For example, the bottom section BL1-A of the barrier layer BL1 covers the non-overlapping portion SV1-B~SV11-B (SV4-B, SV5-B as shown in FIGS. 9A-9B) at the bottom surface of the body portion BP1, and reveals the overlapping portion SV1-A~SV11-A (SV4-A, SV5-A as shown in FIGS. 9A-9B) at the bottom surface of the body portion BP1. In the illustrated embodiment, a width of the sidewall sections BL1-C, BL1-D and BL1-E reduces from a top surface of the source vias SV1~SV11 to a top surface of the source contacts SC1~SC11 (see source vias SV4, SV5, for example). In certain embodiments, the sidewall section BL1-B has a constant width from a top surface of the source vias SV1~SV11 to a top surface of the source contact SC1~SC11 (see source vias SV4, SV5, for example). Furthermore, in some embodiments, a bottom surface of the body portions BP1 of the source vias SV1~SV11 has a step height difference.

As further illustrated in FIG. 9A and FIG. 9B, a dielectric layer (or interlayer dielectric 132) is surrounding the drain vias DV1~DV7 and the source via SV1~SV11. In some embodiments, the dielectric layer (or interlayer dielectric 132) is in physical contact with the barrier-less body portion (e.g. DV3-A shown in FIG. 9A) of the drain vias DV1~DV9 and the barrier layer BL1 of the source vias SV1~SV11. In certain embodiments, the dielectric layer (or interlayer dielectric 132) is physically separated from the body portion BP1 of the source vias SV1~SV11. In the illustrated embodiment, the body portion BP1 of the source via SV4 has a first sidewall surface facing the drain via DV3, and a second sidewall surface facing away from the drain via DV3. For example, the barrier layer BL1 at least cover the first sidewall surface of the body portion BP1 that is facing the drain via DV3 to prevent via to via leakage (e.g. from source via SV4 to drain via DV3). Furthermore, since the body portion BP1 of the source via SV4 is physically joined with the source contact SC4 located underneath without a barrier layer therebetween, a contact resistance may be further reduced.

In the exemplary embodiment, the width or length of the source vias SV1~SV11 along the first direction D1 (as shown in FIG. 1) is greater than the width or length of the drain vias DV1~DV7 along the first direction D1. In other words, a source contact surface area (landing surface) of the source vias SV1~SV11 to the respective source contacts SC1~SC11 is greater than a drain contact surface area of the drain vias DV1~DV7 to the respective drain contacts DC1~DC7. In the exemplary embodiment, the length or width of the source vias SV1~SV11 along the first direction D1 may be in a range of 5 nm to 200 nm. In certain embodiments, the length or width of the drain vias DV1~DV7 along the first direction D1 may be in a range of 3 nm to 50 nm.

After forming the source vias SV1~SV11 and the drain vias DV1~DV7, metal lines ML1 are disposed on and connected to the drain vias DV1~DV7, while metal lines ML2 are disposed on and connected to the source vias SV1~SV11 in the way as shown in FIG. 1. Up to here, a method of fabricating the semiconductor device 100 is accomplished.

Figure 10:
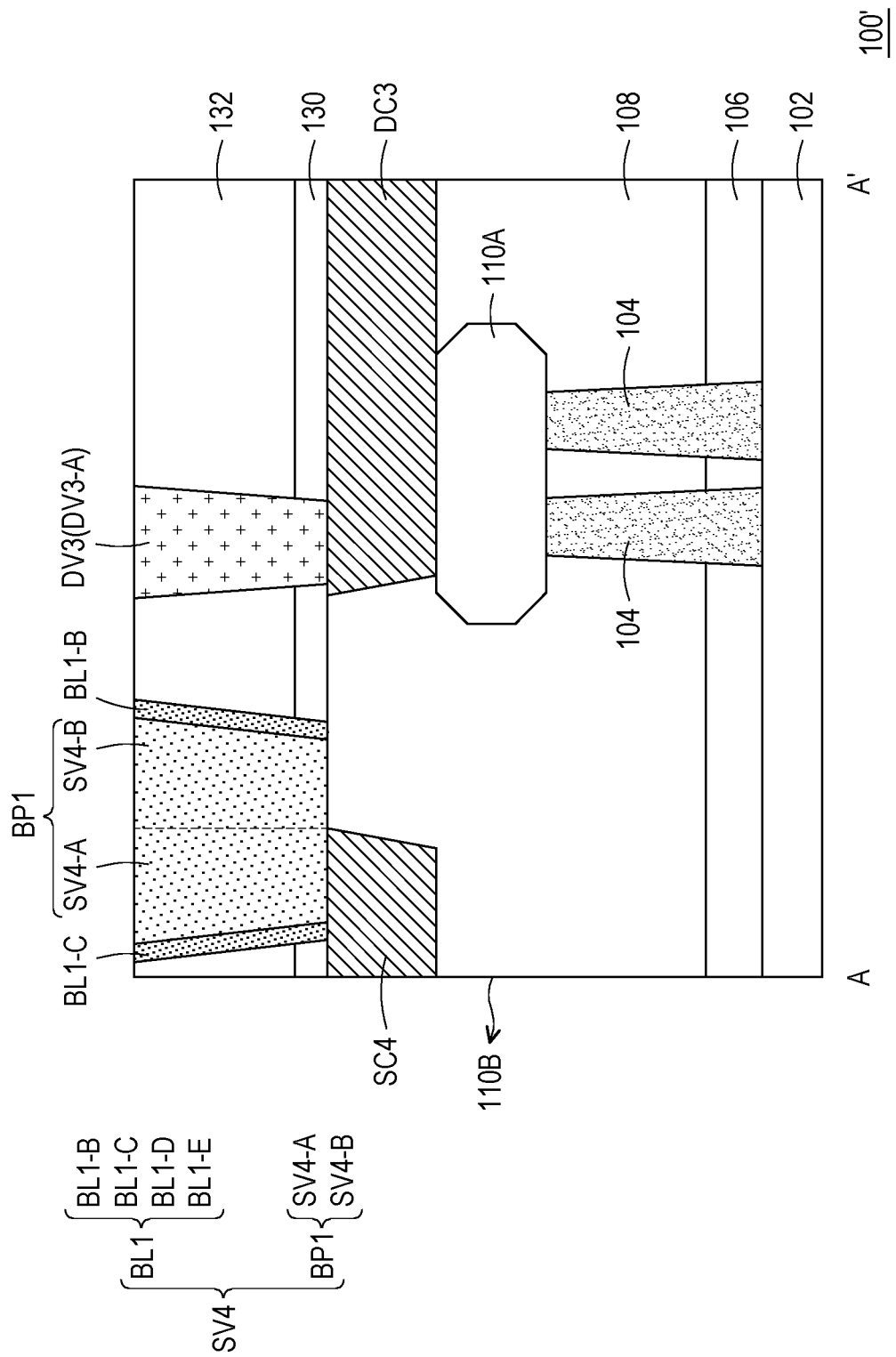
FIG. 10 is a schematic sectional view of a portion of a semiconductor device in accordance with some embodiments of the present disclosure.

FIG. 10 is a schematic sectional view of a portion of a semiconductor device in accordance with some embodiments of the present disclosure. The semiconductor device 100' illustrated in FIG. 10 is similar to the semiconductor device 100 shown in FIG. 1 to FIG. 9B. Therefore, the same reference numerals are used to refer to the same or liked parts, and its detailed description will be omitted herein. In the above embodiment, all of the source vias SV1~SV11 includes a barrier layer BL1 having four sidewall sections BL1-B, BL1-C, BL1-D and BL1-E respectively covering four sidewall surfaces of the body portion BP1, and a bottom section BL1-A partially covers a bottom surface of the body portion BP1. However, the disclosure is not limited thereto. For example, referring to FIG. 10, the source via SV4 includes a barrier layer BL1 having four sidewall sections BL1-B, BL1-C (BL1-D and BL1-E not shown), whereby the bottom section BL1-A is omitted. Furthermore, the four sidewall sections BL1-B, BL1-C, BL1-D and BL1-E has a constant width from a top surface of the source via SV4 to a top surface of the source contact SC4.

In the exemplary embodiment, the body portion BP1 of the source via SV4 has an overlapping portion SV4-A that is in direct contact with the source contact SC4, thus the contact resistance may be further reduced. Furthermore, the source via SV4 at least include a barrier layer BL1 having a sidewall section BL1-B that blocks the via to via leakage path form the source via SV4 to the drain via DV3. As such, the device performance of the semiconductor device 100' can be further improved. Although, the source via SV4 is used as an example in the embodiment shown in FIG. 10, it is noted that the other source vias SV1~SV3 and SV5~SV11 may independently have the same design or arrangement shown in FIG. 10. In other words, any of the source vias SV1~SV11 may be designed to include a barrier layer BL1 that is free of the bottom section BL1-A. In some embodiments, each of the source vias SV1~SV11 may independently have a via design shown in FIG. 9A or a via design shown in FIG. 10. In other words, an arrangement of the barrier layer BL1 of one of the source vias SV1~SV11 may be different from an arrangement of the barrier layer BL1 of another one of the source via SV1~SV11. In one exemplary embodiment, the source via SV4 has a via design shown in FIG. 9A, while the source via SV5 has a via design shown in FIG. 10.

Figure 11:
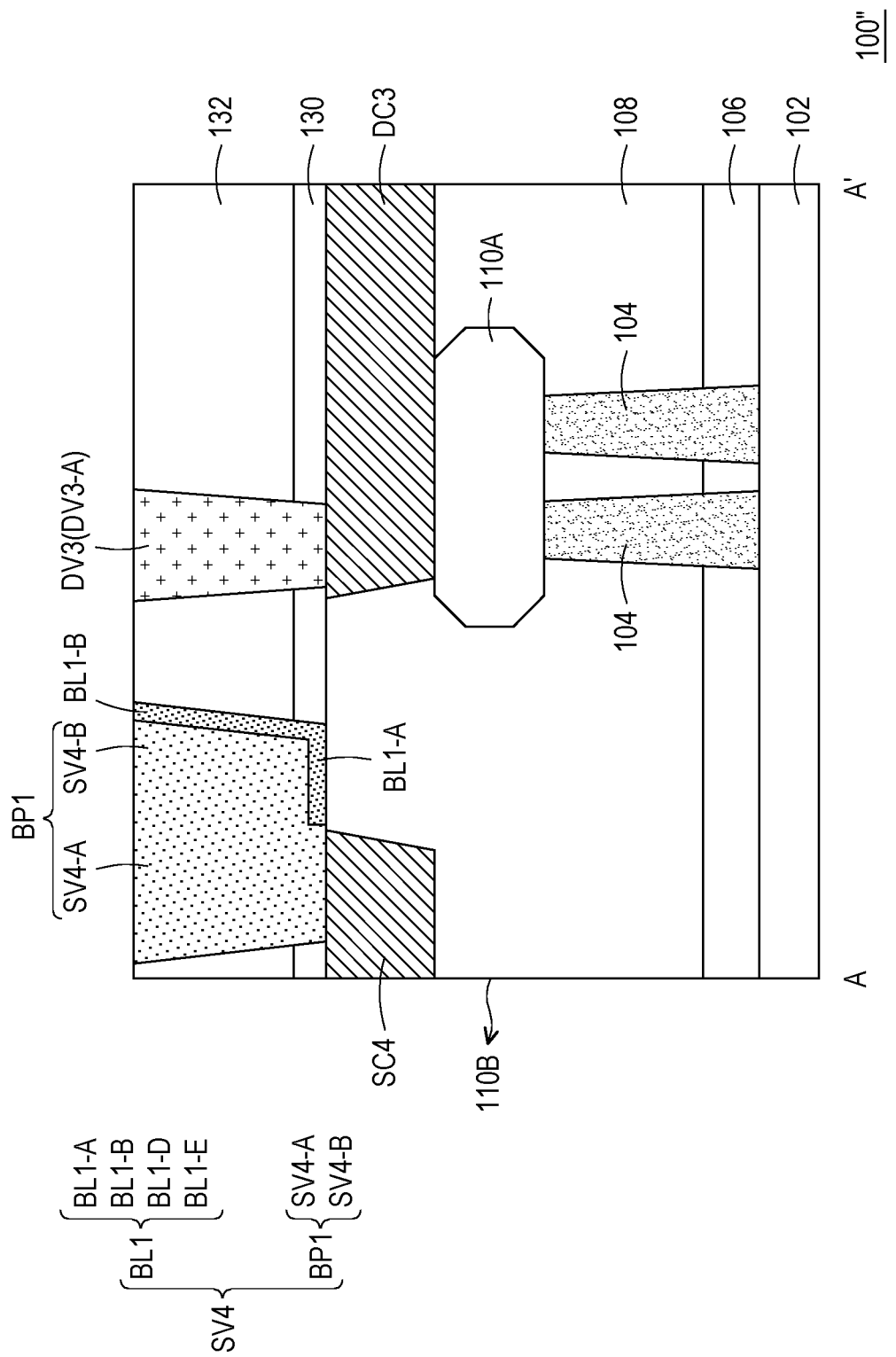
FIG. 11 is a schematic sectional view of a portion of a semiconductor device in accordance with some other embodiments of the present disclosure.

FIG. 11 is a schematic sectional view of a portion of a semiconductor device in accordance with some other embodiments of the present disclosure. The semiconductor device 100" illustrated in FIG. 11 is similar to the semiconductor device 100 shown in FIG. 1 to FIG. 9B. Therefore, the same reference numerals are used to refer to the same or liked parts, and its detailed description will be omitted herein. In the above embodiments, all of the source vias SV1~SV11 includes a barrier layer BL1 having four sidewall sections BL1-B, BL1-C, BL1-D and BL1-E respectively covering four sidewall surfaces of the body portion BP1. However, the disclosure is not limited thereto. For example, referring to FIG. 11, at least the sidewall section BL1-C is omitted from the barrier layer BL1.

In the exemplary embodiment, the body portion BP1 of the source via SV4 has a first sidewall surface (surface of non-overlapping portion SV4-B) facing the drain via DV3, and a second sidewall surface (surface of overlapping portion SV4-A) facing away from the drain via DV3. For example, the second sidewall surface of the body portion BP1 (or surface of overlapping portion SV4-A) is revealed by the barrier layer BL1. Since the body portion BP1 of the source via SV4 has an overlapping portion SV4-A that is in direct contact with the source contact SC4, the contact resistance may be further reduced. Furthermore, the source via SV4 at least include a barrier layer BL1 having a sidewall section BL1-B that blocks the via to via leakage path form the source via SV4 to the drain via DV3. As such, the device performance of the semiconductor device 100" can be further improved. Furthermore, due to the absence of any via structures arranged aside the source via SV4 opposite to the side of the drain via DV3, at least one sidewall surface of the overlapping portion SV4-A of the source via SV4 may be barrier-free. In other words, depending on whether two via structures are arranged nearby, the source vias SV1~SV11 may include a barrier layer BL1 located on a side surface to prevent via to via leakage, or at least one side surface may be barrier-free due to the absence of via structures nearby.

Although, the source via SV4 is used as an example in the embodiment shown in FIG. 11, it is noted that the other source vias SV1~SV3 and SV5~SV11 may independently have the same design or arrangement shown in FIG. 11. In other words, any of the source vias SV1~SV11 may be designed to include a barrier layer BL1 that is free of at least one sidewall section (any one of BL1-B, BL1-C, BL1-D and BL1-E). In some embodiments, each of the source vias SV1~SV11 may independently have a via design shown in FIG. 9A or a via design shown in FIG. 10, or a via design shown in FIG. 11. In other words, an arrangement of the barrier layer BL1 of one of the source vias SV1~SV11 may be different from an arrangement of the barrier layer BL1 of another one of the source via SV1~SV11. In one exemplary embodiment, the source via SV4 has a via design shown in FIG. 9A, the source via SV5 has a via design shown in FIG. 10, while the source via SV2 has a via design shown in FIG. 11.

Figure 12:
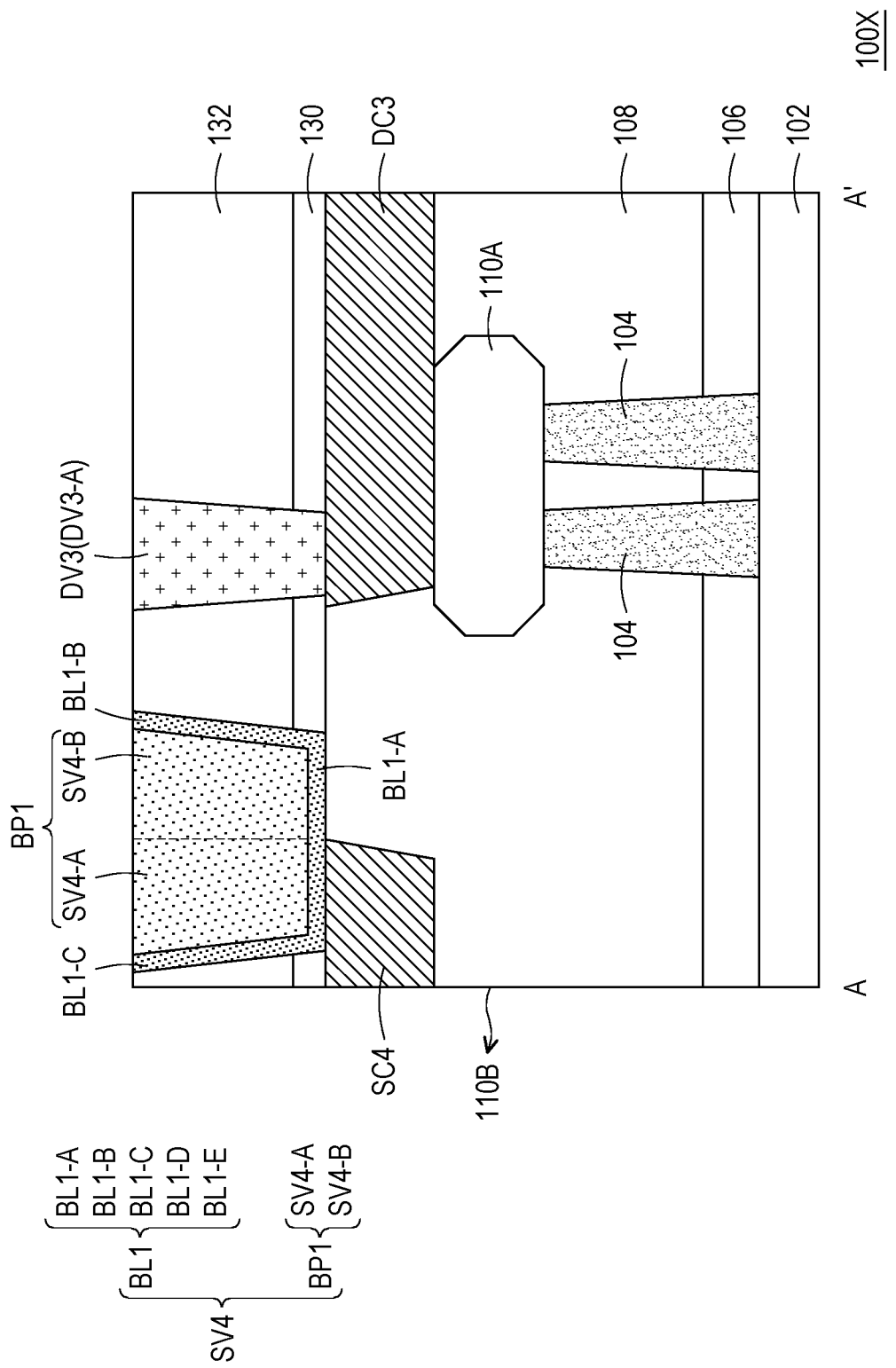
FIG. 12 is a schematic sectional view of a portion of a semiconductor device in accordance with some comparative embodiments of the present disclosure.

FIG. 12 is a schematic sectional view of a portion of a semiconductor device in accordance with some comparative embodiments of the present disclosure. In the comparative embodiment shown in FIG. 12, the source via SV4 includes a barrier layer BL1 having four sidewall sections BL1-B, BL1-C, BL1-D and BL1-E respectively covering four sidewall surfaces of the body portion BP1, and a bottom section BL1-A completely covering a bottom surface of the body portion BP1. Since the body portion BP1 of the source via SV4 is surrounded and protected by the barrier layer BL1, and the body portion BP1 is not in physical contact with the source contact SC4, the contact resistance of the semiconductor device 100X is high, and device performance is deteriorated.

Figure 13:
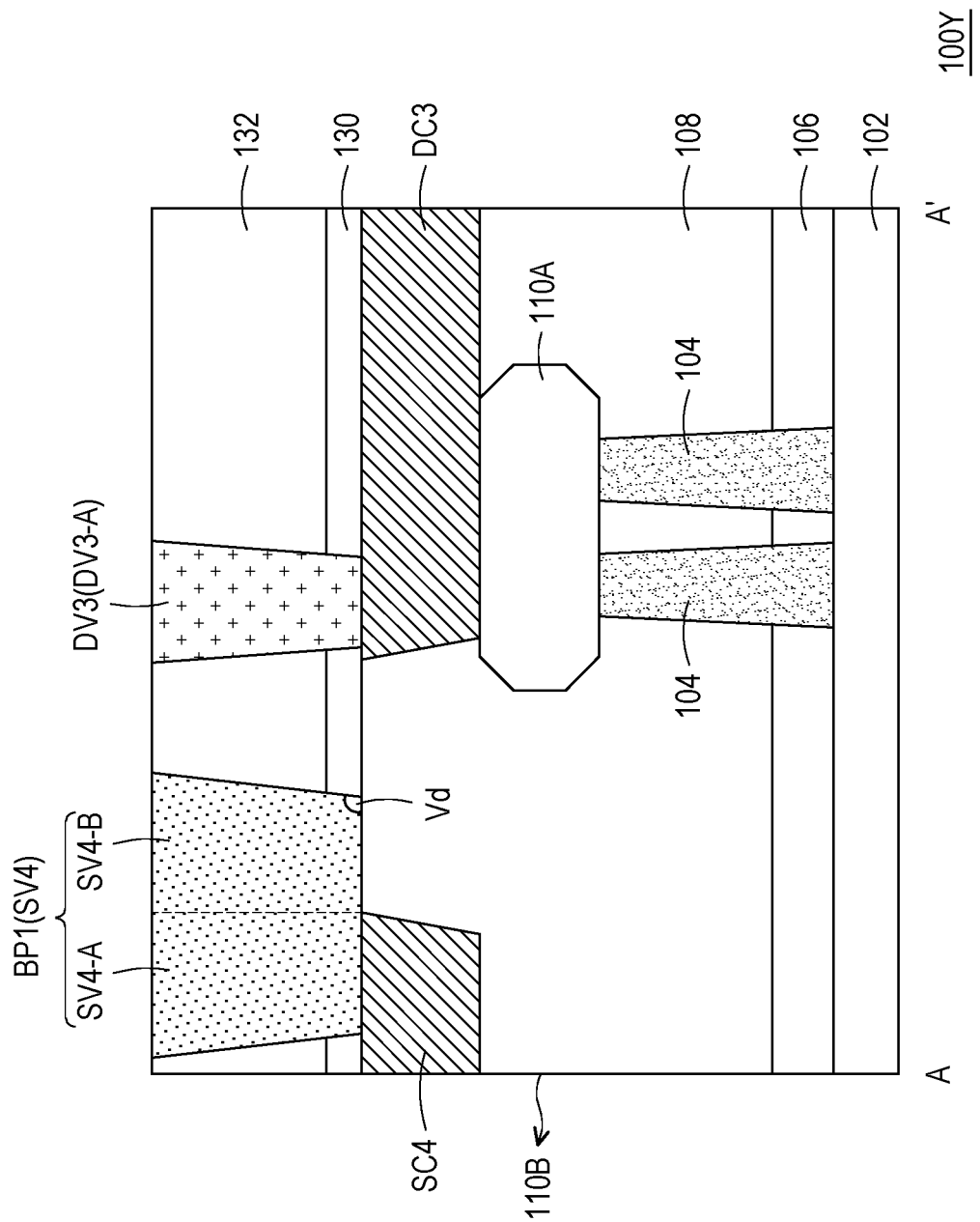
FIG. 13 is a schematic sectional view of a portion of a semiconductor device in accordance with some other comparative embodiments of the present disclosure.

FIG. 13 is a schematic sectional view of a portion of a semiconductor device in accordance with some other comparative embodiments of the present disclosure. In the comparative embodiment shown in FIG. 13, a bottom-up process is performed for depositing the source via SV4. In other words, the source via SV4 is a barrier-free source via including a body portion BP1 having an overlapping portion SV4-A and a non-overlapping portion SV4-B. Since the source via SV4 is made barrier-free, a via to via leakage of the source via SV4 to the drain via DV3 will occur. Furthermore, it is possible that voids Vd are formed at corners of the source vias SV4 due to the bottom-up process. Overall, the device performance of the semiconductor device 100Y is deteriorated.

In the above-mentioned embodiments, the semiconductor device includes a source via having a body portion and a barrier layer surrounding the body portion, and the body portion is in physical contact with the source contact. Furthermore, the barrier layer includes at least one sidewall section separating the source via from an adjacent via structure. As such, the via to via leakage may be prevented. Overall, by providing a semiconductor device having the above structures, the contact resistance is reduced, and the device performance is further improved.

In accordance with some embodiments of the present disclosure, a semiconductor device includes a source region and a drain region, a source contact, a drain contact, a drain via and a source via. The source region and the drain region are disposed over a substrate. The source contact is disposed on the source region. The drain contact is disposed on the drain region. The drain via is connected to the drain contact, wherein the drain via includes a barrier-less body portion. The source via is connected to the source contact, wherein the source via includes a body portion and a barrier layer surrounding the body portion, and the body portion is in physical contact with the source contact.

In accordance with some other embodiments of the present disclosure, a semiconductor device includes a gate structure, a first source contact and a first drain contact, a first source via, a first drain via and a dielectric layer. The first source contact and the first drain contact are disposed aside the gate structure. The first source via is connected to the first source contact, wherein the first source via includes a body portion and a barrier layer surrounding the body portion, and a bottom surface of the body portion has a step height difference. The first drain via is connected to the first drain contact, wherein the barrier layer of the first source via is separating the body portion of the first source via from the first drain via. The dielectric layer is surrounding the first source via and the first drain via.

In accordance with yet another embodiment of the present disclosure, a method of fabricating a semiconductor device is described. The method includes the following steps. A source region and a drain region are disposed over a substrate. A source contact is disposed on the source region. A drain contact is disposed on the drain region. A drain via is formed to be connected to the drain contact, wherein the drain via includes a barrier-less body portion. A source via is formed to be connected to the source contact, wherein the source via includes a body portion and a barrier layer surrounding the body portion, and the body portion is in physical contact with the source contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a source region and a drain region over a substrate;
   a source contact disposed on the source region;
   a drain contact disposed on the drain region;
   a drain via connected to the drain contact, wherein the drain via includes a barrier-less body portion; and
   a source via connected to the source contact, wherein the source via includes a body portion and a barrier layer surrounding the body portion, and the body portion is in physical contact with the source contact.

2. The semiconductor device according to claim 1, further comprising a dielectric layer surrounding the drain via and the source via, wherein the dielectric layer is in physical contact with the barrier-less body portion of the drain via and the barrier layer of the source via, and physically separated from the body portion of the source via.

3. The semiconductor device according to claim 1, wherein the barrier layer of the source via comprises a bottom section and a first sidewall section, the first sidewall section covers a first sidewall surface of the body portion, and the bottom section partially covers a bottom surface of the body portion.

4. The semiconductor device according to claim 3, wherein the barrier layer of the source via further comprises a second sidewall section covering a second sidewall surface of the body portion, and a width of the second sidewall section reduces from a top surface of the source via to a top surface of the source contact.

5. The semiconductor device according to claim 3, wherein a second sidewall surface of the body portion is revealed by the barrier layer.

6. The semiconductor device according to claim 1, further comprising:
   a second source region over the substrate;
   a second source contact disposed on the second source region; and
   a second source via connected to the second source contact, wherein the second source via includes a body portion and a barrier layer surrounding the body portion, and the body portion is in physical contact with the second source contact, and an arrangement of the barrier layer of the second source via is different from an arrangement of the barrier layer of the source via.

7. The semiconductor device according to claim 1, wherein the body portion of the source via includes a first body portion and a second body portion, a height of the first body portion is greater than a height of the second body portion, and the first body portion is in physical contact with the source contact.

8. A semiconductor device, comprising:
   a gate structure;
   a first source contact and a first drain contact disposed aside the gate structure;
   a first source via connected to the first source contact, wherein the first source via includes a body portion and a barrier layer surrounding the body portion, and a bottom surface of the body portion has a step height difference;
   a first drain via connected to the first drain contact, wherein the barrier layer of the first source via is separating the body portion of the first source via from the first drain via; and
   a dielectric layer surrounding the first source via and the first drain via.

9. The semiconductor device according to claim 8, wherein the body portion of the first source via has an overlapping portion and a non-overlapping portion with the first source contact, and the barrier layer covers the non-overlapping portion at the bottom surface of the body portion, and reveals the overlapping portion at the bottom surface of the body portion.

10. The semiconductor device according to claim 9, wherein a height of the overlapping portion is greater than a height of the non-overlapping portion.

11. The semiconductor device according to claim 8, wherein the body portion of the first source via has a first sidewall surface facing the first drain via, and a second sidewall surface facing away from the first drain via, and the second sidewall surface is revealed by the barrier layer.

12. The semiconductor device according to claim 8, wherein the gate structure, the first source contact and the first drain contact are extending along a first direction, and a length of the first source via along the first direction is greater than a length of the first drain via along the first direction.

13. The semiconductor device according to claim 8, wherein the first drain via includes a body portion that is barrier-free.

14. The semiconductor device according to claim 8, wherein the barrier layer of the first source via comprises a first sidewall section covering a first sidewall surface of the body portion, and a second sidewall section covering a second sidewall surface of the body portion, wherein the first sidewall section has a constant width from a top surface of the first source via to a top surface of the first source contact, and the second sidewall section has a width that reduces from the top surface of the first source via to the top surface of the first source contact.

15. The semiconductor device according to claim 8, further comprising:
   a second source contact disposed aside the gate structure; and
   a second source via connected to the second source contact, wherein the second source via includes a body portion and a barrier layer surrounding the body portion, and the body portion is in physical contact with the second source contact, and an arrangement of the barrier layer of the second source via is different from an arrangement of the barrier layer of the first source via.

16. A method of fabricating a semiconductor device, comprising:

forming a source region and a drain region over a substrate;

forming a source contact disposed on the source region;

forming a drain contact disposed on the drain region;

forming a drain via connected to the drain contact, wherein the drain via includes a barrier-less body portion; and forming a source via connected to the source contact, wherein the source via includes a body portion and a barrier layer surrounding the body portion, and the body portion is in physical contact with the source contact.

17. The method according to claim 16, wherein forming the source via comprises:

forming a dielectric layer over the source contact;

forming an opening in the dielectric layer revealing portions of the source contact;

forming a blocking layer covering the source contact;

forming the barrier layer in the opening and removing the blocking layer to reveal the source contact; and forming the body portion in the opening over the barrier layer so that the body portion is in physical contact with the source contact.

18. The method according to claim 17, wherein the dielectric layer is formed to be in physical contact with the barrier-less body portion of the drain via and the barrier layer of the source via, and to be physically separated from the body portion of the source via.

19. The method according to claim 16, wherein the barrier layer of the source via is formed with a bottom section and a first sidewall section, the first sidewall section covers a first sidewall surface of the body portion, and the bottom section partially covers a bottom surface of the body portion.

20. The method according to claim 16, wherein the drain via and the source via are formed in different steps.

* * * * *